United States Patent
Yamaguchi et al.

(10) Patent No.: US 6,407,573 B1
(45) Date of Patent: *Jun. 18, 2002

(54) DEVICE FOR EVALUATING CHARACTERISTIC OF INSULATED GATE TRANSISTOR

(75) Inventors: Kenji Yamaguchi; Hiroyuki Amishiro; Yuko Maruyama, all of Tokyo (JP)

(73) Assignees: Mitsubishi Denki Kabushiki Kaisha; Mitsubishi Electric Engineering Co., Ltd., both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/238,887

(22) Filed: Jan. 28, 1999

(30) Foreign Application Priority Data

Jul. 28, 1998 (JP) .............................. 10-213019

(51) Int. Cl.$^7$ ............................... G01R 31/26

(52) U.S. Cl. ................... 324/769; 324/765; 324/719

(58) Field of Search ............................... 324/769, 765, 324/719; 438/14, 17; 257/48

(56) References Cited

U.S. PATENT DOCUMENTS

| | | | | |
|---|---|---|---|---|
| 4,115,709 A | * | 9/1978 | Inoue | 307/304 |
| 4,627,083 A | * | 12/1986 | Pelgrom | 377/60 |
| 5,130,763 A | * | 7/1992 | Delhaye | 357/22 |
| 5,489,787 A | * | 2/1996 | Amaratunga | 257/137 |
| 6,169,415 B1 | * | 1/2001 | Yamaguchi | 324/769 |

OTHER PUBLICATIONS

Yuan Taur, et al., "A New 'Shift and Ratio' Method for MOSFET Channel–Length Extraction," IEEE Electron Device Letters, vol. 13, No. 5, (May 1992); pp. 267–269.

S. Biesemans, et al., "Accurate Determination of Channel Length, Series Resistance and Junction Doping Profile for MOSFET Optimisation In Deep Submicron Technologies," 1996 Symposium on VLSI Technologies Digest of Technical Papers, pp. 166–167. (Month Unavailable).

K. Yamaguchi, et al., "A New Variational Method to Determine Effective Channel Length and Series Resistance of MOSFET's," Proc. IEEE 1998 Int. Conference on Microelectronic Test Structures, vol. 11, (Mar. 1998), pp. 123–126.

* cited by examiner

Primary Examiner—Vinh P. Nguyen
Assistant Examiner—Trung Q. Nguyen
(74) Attorney, Agent, or Firm—Oblon, Spivak, McClelland, Maier & Neustadt, P.C.

(57) ABSTRACT

A transistor having a longer channel length and serving as a reference, and a transistor having a shorter channel length and to be subjected to effective channel length extraction are prepared (step ST1.1). A hypothetical point at which a change in a total drain-to-source resistance is estimated to be approximately zero when a gate overdrive is slightly changed is extracted in a mask channel length versus total drain-to-source resistance plane. The values of a function (F) are calculated which are defined by the difference between the rate of change in the total drain-to-source resistance and the product of a channel resistance per unit length and the rate of change in a mask channel length at the hypothetical points (step ST1.6). A true threshold voltage of the transistor having the shorter channel length is determined by a shift amount ($\delta$) which minimizes the standard deviation of the function (F) determined in the step ST1.7 (step ST1.10). A resistance-based method thus extracts an effective channel length and a series resistance with increased accuracy.

11 Claims, 22 Drawing Sheets

F I G. 16
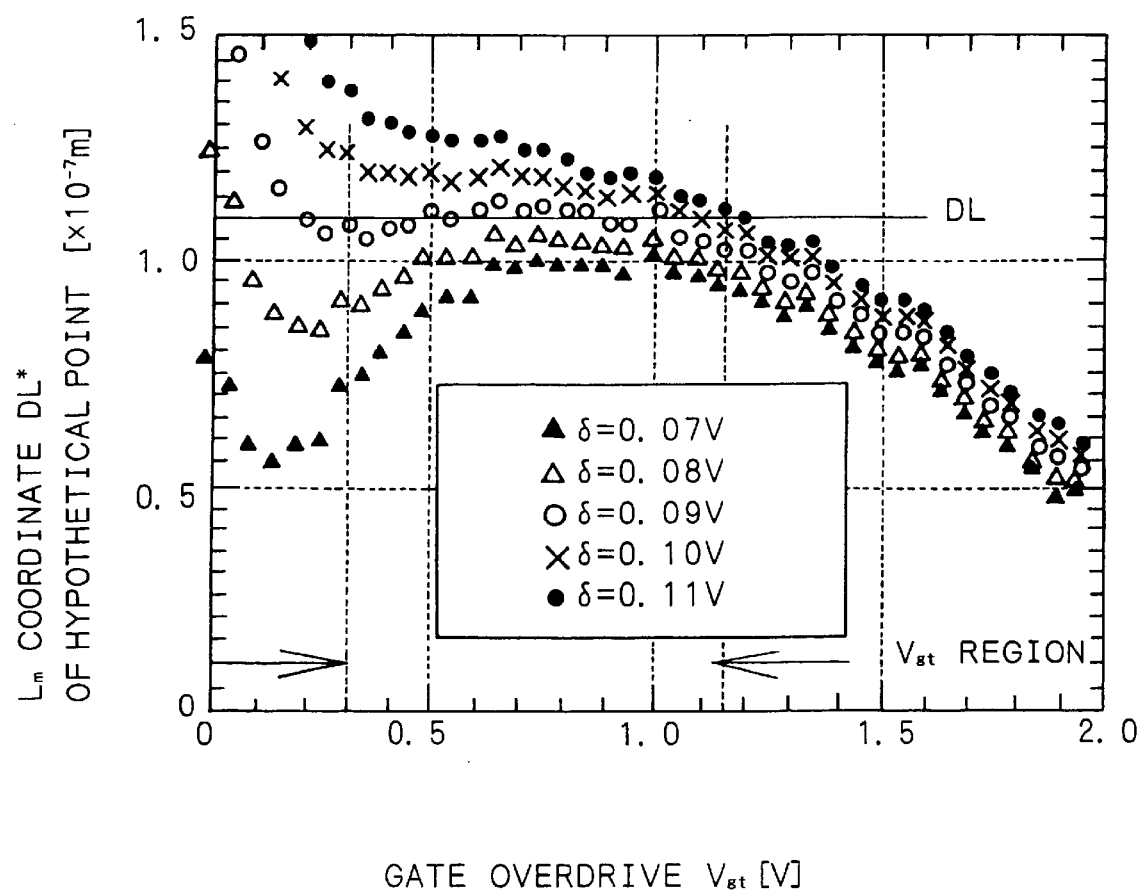

F I G. 33
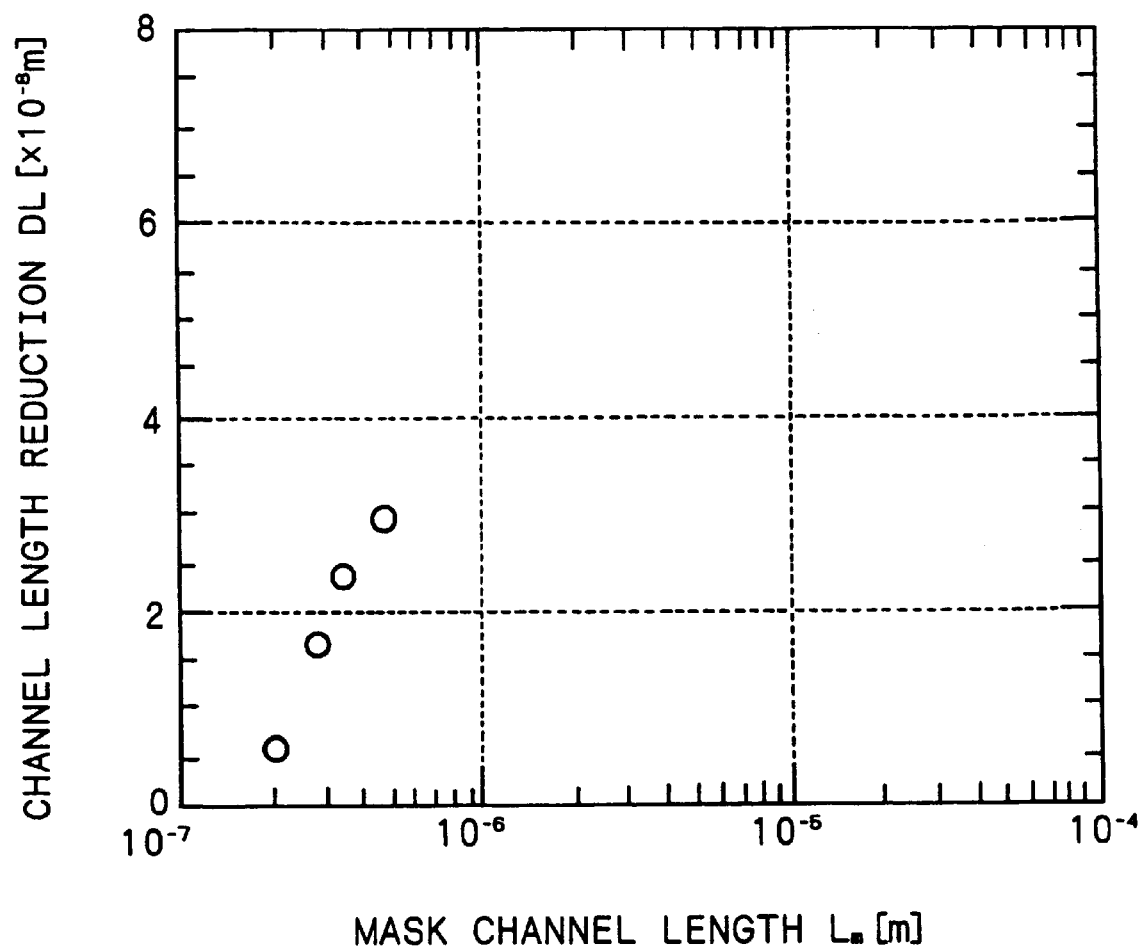

DEVICE FOR EVALUATING CHARACTERISTIC OF INSULATED GATE TRANSISTOR

BACKGROUND OF THE INVENTION

1. Field of the Invention

The present invention relates to a device for evaluating a characteristic of an insulated gate transistor which extracts the effective channel length and also the series resistance of the insulated gate transistor.

2. Description of the Background Art

The resistance-based method is intended for extracting a series resistance $R_{sd}$ and an effective channel length $L_{eff}$. However, the resistance-based method determines a channel length reduction DL ($=L_m-L_{eff}$) in place of the effective channel length $L_{eff}$ where $L_m$ is a mask channel length (designed channel length). The resistance-based method carries out the extraction on the assumption that a total drain-to-source resistance $R_{tot}$ is the sum of the series resistance $R_{sd}$ and a channel resistance $R_{ch}$. A relationship which holds between the effective channel length $L_{eff}$ and the channel resistance $R_{ch}$ is such that the channel resistance $R_{ch}$ is the product of the effective channel length $L_{eff}$ and a channel resistance f per unit length. FIG. 24 conceptually shows the relationship between the channel resistance $R_{ch}$, the series resistance $R_{sd}$, the effective channel length $L_{eff}$, the mask channel length $L_m$, and the channel length reduction DL. The relationship shown in FIG. 25 approximately holds between the total drain-to-source resistance $R_{tot}$ and the mask channel length $L_m$. Specifically, with a gate voltage $V_{gs}$ or the gate voltage $V_{gs}$ minus a threshold voltage $V_{th}$ held constant, the total drain-to-source resistance $R_{tot}$ changes in constant proportion to the mask channel length $L_m$. The gate voltage $V_{gs}$ minus the threshold voltage $V_{th}$ is referred to hereinafter as a gate overdrive $V_{gt}$. It is assumed that $R_{tot-Lm}$ lines for various values of the gate overdrive $V_{gt}$ intersect at one point. The mask channel length $L_m$ coordinate of the point of intersection is represented by DL*, and the total drain-to-source resistance $R_{tot}$ coordinate thereof is represented by $R_{sd}$*. The symbol * which follows the reference character representing a value indicates that the value is determined based on such a relationship which holds between the total drain-to-source resistance $R_{tot}$ and the mask channel length $L_m$, in other words, based on characteristic curves plotted in the X-Y plane defined by an X-axis which denotes the mask channel length and a Y-axis which denotes the total drain-to-source resistance.

Many types of resistance-based method have been hitherto proposed, among which the Terada-Muta-Chern method (referred to hereinafter as the TMC method) and the Shift and Ratio method (referred to hereinafter as the S&R method) are generally used.

First, the TMC method is described with reference to FIGS. 26 and 27. Expression (1) providing the relationship between the total drain-to-source resistance $R_{tot}$, the effective channel length $L_{eff}$, the resistance f per channel unit length and the series resistance $R_{sd}$ is transformed into Expression (4) by using Expression (2) providing the relationship between the effective channel length $L_{eff}$, the mask channel length $L_m$ and the channel length reduction DL and Expression (3) providing a variable A.

$$R_{tot}=L_{eff} \cdot f+R_{sd} \quad (1)$$

$$L_{eff}=L_m-DL \quad (2)$$

$$A \equiv -DL \cdot f + R_{sd} \quad (3)$$

$$R_{tot}=L_m \cdot f+A \quad (4)$$

It is found from Expression (4) that the resistance f per unit length and the variable A are determined from the relationship between the total drain-to-source resistance $R_{tot}$ and the mask channel length $L_m$. The total drain-to-source resistance $R_{tot}$, the mask channel length $L_m$ and the resistance f per unit length which serve as a function of the gate overdrive $V_{gt}$ must be determined, with the gate overdrive $V_{gt}$ held constant. As shown in FIG. 26, for example, a plurality of lines may be plotted for different gate overdrives $V_{gt1}$, $V_{gt2}$, . . . by measuring the total drain-to-source resistance $R_{tot}$ of MOS transistors having the mask channel length $L_m$ which takes values $L_{m1}$ to $L_{m4}$. Then, values $f_1$, $f_2$, . . . of the resistance f per unit length and values $A_1$, $A_2$, . . . of the variable A defined in Expression (3) are found from the slopes and $R_{tot}$-intercepts of the respective plotted lines.

With attention focused on Expression (3), the TMC method extracts the channel length reduction DL and the series resistance $R_{sd}$ based on the slope and $R_{tot}$-intercept of the line of the graph of FIG. 27 since the values $f_1$, $f_2$, . . . of the resistance f and the values $A_1$, $A_2$, . . . of the variable A which are found in the above described manner are in the relationship shown in the graph of FIG. 27. The threshold voltage $V_{th}$ of the MOS transistor which serves as a reference for the calculation of the gate overdrive $V_{gt}$ is determined by extrapolation from a source-drain current versus gate voltage characteristic as shown in FIG. 28.

The TMC method is of low extraction accuracy because of the uncertainty of the threshold voltage $V_{th}$ obtained by the extrapolation, and thus is not adaptable for an application to transistors which are not greater than 0.35 μm in channel length. FIG. 29 shows the influence of the uncertainty of the gate overdrive $V_{gt}$ in the case where the mask channel length $L_m$ coordinate value DL* of the point of intersection is determined using two transistors. There is no problem if the gate overdrives $V_{gt}$ of the two transistors differ by the same amount from the true $V_{gt}$. On the other hand, a 0.01 V difference in gate overdrive $V_{gt}$ between the two transistors, for example, causes an error on the order of slightly less than 0.01 μm. The extraction error of the threshold voltage $V_{th}$ of one of the transistors which has a shorter gate length due to the series resistance $R_{sd}$ is about −0.02 V when the extrapolation is used for the extraction of the threshold voltage $V_{th}$. Thus, the extraction error of the channel length reduction DL resulting from the uncertainty of the threshold voltage $V_{th}$ is estimated to be about −0.01 to about −0.02 μm. Additionally, when data obtained by measuring the gate voltage $V_{gs}$ at intervals of 0.1 V are used, there is a likelihood that a quantization error causes the extraction error of the threshold voltage $V_{th}$ on the order of ±0.01V, thereby causing the extraction error of the channel length reduction DL.

Next, the S&R method is described below with reference to FIGS. 30 and 31. The S&R method provides the channel length reduction DL using Expression (5) using two MOS transistors Sh and Lo which are equal in mask channel width $W_m$ but differ in mask channel length $L_m$. The MOS transistor Lo is a transistor having a channel length long enough to ignore the influence of the channel length reduction DL, and the MOS transistor Sh is a transistor having a shorter channel length.

$$DL = L_{mSh} - \frac{L_{mLo}}{\langle ri \rangle} \quad (5)$$

where $$ri = \frac{R'_{totLo}(V_{gs})}{R'_{totSh}(V_{gs} + \delta_0)}$$

where the marks "<>" denote an average value in a given region of the gate overdrive $V_{gt}$, the prime denotes a first derivative with respect to the gate overdrive $V_{gt}$, and $\delta_0$ is the difference ($V_{thSh}-V_{thLo}$) between the threshold voltages $V_{thSh}$ and $V_{thLo}$ of the two MOS transistors Sh and Lo.

In other words, the S&R method results in the problem of determining <ri> for the correct gate overdrive $V_{gt}$. An algorithm for determining <ri> is as follows:

Step 1: extracting the threshold voltage $V_{thLo}$ of the transistor Lo

Step 2: shifting $R_{totSh}$' to $R_{totSh}$'+$\delta$ to calculate the average value <ri> and a standard deviation $\sigma$ (ri) in a given region of the gate overdrive $V_{gtLo}$ ($=V_{gs}-V_{thLo}$) (See FIG. 30) Step 3: repeating Step 2, with the shift amount $\delta$ changed Step 4: providing <ri> as <ri>$\delta=\delta_0$ where $\delta_0$ is the shift amount $\delta$ when $\sigma$ (ri)$^2$ is a minimum, based on the result of Step 3.

It should be noted that the changes in the shift amount $\delta$ are equivalent to changes in the threshold voltage $V_{thSh}$ of the short transistor Sh.

The S&R method reduces the error resulting from the uncertainty of the threshold voltage $V_{th}$ which is the problem with the TMC method, but presents another problem in that the region of the gate overdrive $V_{gt}$ to be calculated must be adequately determined so that the appropriate channel length reduction DL is obtained. The S&R method determines <ri> on the assumption that, when the gate overdrive $V_{gt}$ is small, ri is a constant value, in spite of the dependence of ri upon the gate overdrive $V_{gt}$. As a result, the channel length reduction DL extracted by the S&R method is dependent upon the region of the gate overdrive $V_{gt}$ (See FIG. 32).

The S&R method requires the mask channel length $L_{mLo}$ of the long transistor Lo to be sufficiently greater than the mask channel length $L_{mSh}$ of the short transistor Sh. As the mask channel length $L_{mLo}$ of the long transistor Lo approaches the mask channel length $L_{mSh}$ of the short transistor Sh, <ri> approaches "1," and the value of the channel length reduction DL accordingly approaches "0" as will be found from Expression (5) (See FIG. 33). This problem results from the formulation in defiance of the dependence of the channel length reduction DL and the series resistance $R_{sd}$ upon the gate overdrive $V_{gt}$.

As above described, the conventional resistance-based method is disadvantageous in the low extraction accuracy of the effective channel length and the series resistance, and in the dependence of the extraction accuracy thereof upon the setting of parameters. For example, the TMC method extracts the effective channel length and the series resistance with low accuracy because of the error resulting from the uncertainty of the threshold voltage determined by the extrapolation. The S&R method reduces the extraction error of the effective channel length resulting from the uncertainty of the threshold voltage, but has the drawback that the value of the effective channel length to be extracted changes greatly depending on the range of the gate overdrive $V_{gt}$ to be specified for calculation.

SUMMARY OF THE INVENTION

A first aspect of the present invention is intended for a method of evaluating a characteristic of an insulated gate transistor. According to the present invention, the method comprises the steps of: (a) preparing at least two insulated gate transistors differing from each other only in mask channel length and including a first insulated gate transistor having a longer channel length and a second insulated gate transistor having a shorter channel length; (b) extracting a threshold voltage for the first insulated gate transistor to estimate a threshold voltage for the second insulated gate transistor to define the estimated value of the threshold voltage as a first estimated value; (c) extracting a hypothetical point at which a change in a total drain-to-source resistance is estimated to be approximately zero when a first gate overdrive and a second gate overdrive are slightly changed, based on a characteristic curve plotted in an X-Y plane with the mask channel length measured on an X-axis and the total drain-to-source resistance measured on a Y axis, the characteristic curve indicating the relationship between the mask channel length of the first and second insulated gate transistors and the total drain-to-source resistance on the condition that the first and second gate overdrives are equal, the value of the mask channel length and the value of the total drain-to-source resistance at the hypothetical point being defined as second and third estimated values, respectively, and also extracting the slope of the characteristic curve at the hypothetical point to define the extracted value of the slope as a fourth estimated value, the first gate overdrive being defined as the difference between the gate voltage of the first insulated gate transistor and the extracted threshold voltage of the first insulated gate transistor, the second gate overdrive being defined as the difference between the gate voltage of the second insulated gate transistor and the first estimated value; (d) repeating the step (c) with the first estimated value changed; (e) determining optimum second to fourth estimated values that are respective ones of the second to fourth estimated values which satisfy that the amount of change in the third estimated value equals the product of the amount of change in the second estimated value and the fourth estimated value when the first and second gate overdrives are slightly changed, to determine an optimum first estimated value associated with the optimum second to fourth estimated values, thereby to determine a true threshold voltage of the second insulated gate transistor based on the optimum first estimated value; and (f) determining the difference between the mask channel length and an effective channel length, and a series resistance, based on the true threshold voltage.

Preferably, according to a second aspect of the present invention, in the method of the first aspect, the characteristic curve is approximated in the step (e) using a first line drawn in the X-Y plane and passing through first and second points, the first point being given for the first insulated gate transistor when the first gate overdrive has a first value, the second point being given for the second insulated gate transistor when the second gate overdrive has the first value.

Preferably, according to a third aspect of the present invention, in the method of the second aspect, the optimum second to fourth estimated values which satisfy that the amount of change in the third estimated value equals the product of the amount of change in the second estimated value and the fourth estimated value when the first and second gate overdrives are slightly changed are determined in the step (e) using the relationship expressed by $$F(\delta, V_{gtLo}) = dL^*(\delta, V_{gtLo}) + \frac{f(\delta, V_{gtLo})}{f'(\delta, V_{gtLo})} \cdot dL^{*'}(\delta, V_{gtLo}) - DL^*(\delta, V_{gtLo})$$

where δ is the difference between the first estimated value of the threshold voltage of the second insulated gate transistor and the threshold voltage of the first insulated gate transistor, $V_{gtLo}$ is the first gate overdrive, dL* is an X-intercept provided by extrapolation from the characteristic curve, f is the slope of the characteristic curve at the hypothetical point, DL* is the X coordinate of the hypothetical point, and the prime denotes a first derivative with respect to $V_{gtLo}$.

Preferably, according to a fourth aspect of the present invention, in the method of the second aspect, the optimum second to fourth estimated values which satisfy that the amount of change in the third estimated value equals the product of the amount of change in the second estimated value and the fourth estimated value when the first and second gate overdrives are slightly changed are determined in the step (e) using the relationship expressed by $$F(\delta, V_{gtLo}) = \frac{f^2(\delta, V_{gtLo})}{f'(\delta, V_{gtLo})} \cdot dL^{*'}(\delta, V_{gtLo}) - R^*_{sd}(\delta, V_{gtLo})$$

where δ is the difference between the first estimated value of the threshold voltage of the second insulated gate transistor and the threshold voltage of the first insulated gate transistor, $V_{gtLo}$ is the first gate overdrive, dL* is an X-intercept provided by extrapolation from the characteristic curve, f is the slope of the characteristic curve at the hypothetical point, $R_{sd}^*$ is the Y coordinate of the hypothetical point, and the prime denotes a first derivative with respect to $V_{gtLo}$.

Preferably, according to a fifth aspect of the present invention, in the method of the second aspect, the optimum second to fourth estimated values which satisfy that the amount of change in the third estimated value equals the product of the amount of change in the second estimated value and the fourth estimated value when the first and second gate overdrives are slightly changed are determined in the step (e) using the relationship expressed by $$F(\delta, V_{gtLo}) = R^*(\delta, V_{gtLo}) - \frac{f(\delta, V_{gtLo})}{f'(\delta, V_{gtLo})} \cdot R^{*'}(\delta, V_{gtLo}) - R^*_{sd}(\delta, V_{gtLo})$$

where δ is the difference between the first estimated value of the threshold voltage of the second insulated gate transistor and the threshold voltage of the first insulated gate transistor, $V_{gtLo}$ is the first gate overdrive, R* is a Y-intercept provided by extrapolation from the characteristic curve, f is the slope of the characteristic curve at the hypothetical point, $R_{sd}^*$ is the Y coordinate of the hypothetical point, and the prime denotes a first derivative with respect to $V_{gtLo}$.

Preferably, according to a sixth aspect of the present invention, in the method of the second aspect, the optimum second to fourth estimated values which satisfy that the amount of change in the third estimated value equals the product of the amount of change in the second estimated value and the fourth estimated value when the first and second gate overdrives are slightly changed are determined in the step (e) using the relationship expressed by $$F(\delta, V_{gtLo}) = \frac{R^{*'}(\delta, V_{gtLo})}{f'(\delta, V_{gtLo})} + DL^*(\delta, V_{gtLo})$$

where δ is the difference between the first estimated value of the threshold voltage of the second insulated gate transistor and the threshold voltage of the first insulated gate transistor, $V_{gtLo}$ is the first gate overdrive, R* is a Y-intercept provided by extrapolation from the characteristic curve, f is the slope of the characteristic curve at the hypothetical point, DL* is the X coordinate of the hypothetical point, and the prime denotes a first derivative with respect to $V_{gtLo}$.

A seventh aspect of the present invention is intended for a method of evaluating a characteristic of an insulated gate transistor. According to the present invention, the method comprises the steps of: (a) preparing at least two insulated gate transistors differing from each other only in mask channel length and including a first insulated gate transistor having a longer channel length and a second insulated gate transistor having a shorter channel length; (b) extracting a threshold voltage for the first insulated gate transistor to estimate a threshold voltage for the second insulated gate transistor to define the estimated value of the threshold voltage as a first estimated value; (c) extracting a hypothetical point at which a change in a total drain-to-source resistance is estimated to be approximately zero when a first gate overdrive and a second gate overdrive are slightly changed, based on a characteristic curve plotted in an X-Y plane with the mask channel length measured on an X-axis and the total drain-to-source resistance measured on a Y-axis, the characteristic curve indicating the relationship between the mask channel length of the first and second insulated gate transistors and the total drain-to-source resistance on the condition that the first and second gate overdrives are equal, the value of the mask channel length at the hypothetical point being defined as a second estimated value, the first gate overdrive being defined as the difference between the gate voltage of the first insulated gate transistor and the extracted threshold voltage of the first insulated gate transistor, the second gate overdrive being defined as the difference between the gate voltage of the second insulated gate transistor and the first estimated value; (d) repeating the step (c) with the first estimated value changed; (e) determining an optimum first estimated value among the first and second estimated values associated with the steps (b), (c) and (d), the optimum first estimated value satisfying that a characteristic curve indicating the relationship between the second gate overdrive measured on an X-axis and the second estimated value measured on a Y-axis has a predetermined configuration in a predetermined range of the second gate overdrive, to determine a true threshold voltage of the second insulated gate transistor based on the optimum first estimated value; and (f) determining the difference between the mask channel length and an effective channel length, and a series resistance, based on the true threshold voltage.

Preferably, according to an eighth aspect of the present invention, in the method of the seventh aspect, the characteristic curve includes a plurality of characteristic curves, and the step (e) comprises the step of determining among the plurality of characteristic curves an optimum characteristic curve exhibiting the second estimated value which converge best on a constant value within the predetermined range to detect the characteristic curve having the predetermined configuration.

According to a ninth aspect of the present invention, a method of evaluating a characteristic of an insulated gate transistor comprises the steps of: (a) extracting an effective channel length from each of at least two drain current versus gate voltage characteristics differing from each other in source-drain voltage, by using a resistance-based method; and (b) determining an effective channel length by extrapolation from the effective channel lengths extracted for different source-drain voltages.

According to a tenth aspect of the present invention, a method of fabricating an insulated gate transistor comprises the steps of: producing at least two insulated gate transistors differing from each other only in mask channel length; measuring a drain current characteristic of the two insulated gate transistors, with a gate voltage and a source-drain voltage changed; determining a threshold voltage and an effective channel length of the insulated gate transistors by using a method of evaluating a characteristic of an insulated gate transistor as recited in one of the first to ninth aspects; and judging specification fitness of the drain current characteristic, the threshold voltage and the effective channel length.

An eleventh aspect of the present invention is intended for an insulated gate transistor characteristic evaluation device using at least two insulated gate transistors differing from each other only in mask channel length and including a first insulated gate transistor having a longer channel length and a second insulated gate transistor having a shorter channel length, the insulated gate transistor characteristic evaluation device for evaluating a characteristic of the second insulated gate transistor using a characteristic of the first insulated gate transistor as a reference. According to the present invention, the insulated gate transistor characteristic evaluation device comprises: threshold voltage estimation means for extracting a threshold voltage for the first insulated gate transistor to estimate a threshold voltage for the second insulated gate transistor to define the estimated value as a first estimated value; extraction means for extracting a hypothetical point at which a change in a total drain-to-source resistance is estimated to be approximately zero when first and second gate overdrives are slightly changed, based on a characteristic curve drawn in an X-Y plane with the mask channel length measured on an X-axis and the total drain-to-source resistance measured on a Y-axis, the characteristic curve indicating the relationship between the mask channel length of the first and second insulated gate transistors and the total drain-to-source resistance, the value of the mask channel length and the value of the total drain-to-source resistance at the hypothetical point being defined as second and third estimated values, respectively, the extraction means also extracting the slope of the characteristic curve at the hypothetical point to define the value of the slope as a fourth estimated value, the first gate overdrive being defined as the difference between the gate voltage of the first insulated gate transistor and the extracted threshold voltage of the first insulated gate transistor, the second gate overdrive being defined as the difference between the gate voltage of the first and second insulated gate transistors and the firs t estimated value; threshold voltage determination means for determining optimum second to fourth estimated values that are respective ones of the second to fourth estimated values which satisfy that the amount of change in the third estimated value equals the product of the amount of change in the second estimated value and the fourth estimated value when the first and second gate overdrives are slightly changed, to determine an optimum first estimated value associated with the optimum second to fourth estimated values, thereby to determine a true threshold voltage of the second insulated gate transistor based on the optimum first estimated value; and channel length reduction determination means for determining the difference between the mask channel length and an effective channel length, and a series resistance, based on the true threshold voltage.

Preferably, according to a twelfth aspect of the present invention, in the insulated gate transistor characteristic evaluation device of the eleventh aspect, the extraction means approximates the characteristic curve using a first line drawn in the X-Y plane and passing through first and second points, the first point being given for the first insulated gate transistor when the first gate overdrive has a first value, the second point being given for the second insulated gate transistor when the second gate overdrive has the first value.

Preferably, according to a thirteenth aspect of the present invention, in the insulated gate transistor characteristic evaluation device of the twelfth aspect, the threshold voltage determination means determines the optimum second to fourth estimated values which satisfy that the amount of change in the third estimated value equals the product of the amount of change in the second estimated value and the fourth estimated value when the first and second gate overdrives are slightly changed, using the relationship expressed by $$F(\delta, V_{gtLo}) = dL^*(\delta, V_{gtLo}) + \frac{f(\delta, V_{gtLo})}{f'(\delta, V_{gtLo})} \cdot dL^{*\prime}(\delta, V_{gtLo}) - DL^*(\delta, V_{gtLo})$$

where $\delta$ is the difference between the first estimated value of the threshold voltage of the second insulated gate transistor and the threshold voltage of the first insulated gate transistor, $V_{gtLo}$ is the first gate overdrive, $dL^*$ is an X-intercept provided by extrapolation from the characteristic curve, f is the slope of the characteristic curve at the hypothetical point, $DL^*$ is the X coordinate of the hypothetical point, and the prime denotes a first derivative with respect to $V_{gtLo}$.

Preferably, according to a fourteenth aspect of the present invention, in the insulated gate transistor characteristic evaluation device of the twelfth aspect, the threshold voltage determination means determines the optimum second to fourth estimated values which satisfy that the amount of change in the third estimated value equals the product of the amount of change in the second estimated value and the fourth estimated value when the first and second gate overdrives are slightly changed, using the relationship expressed by $$F(\delta, V_{gtLo}) = \frac{f^2(\delta, V_{gtLo})}{f'(\delta, V_{gtLo})} \cdot dL^{*\prime}(\delta, V_{gtLo}) - R_{sd}^*(\delta, V_{gtLo})$$

where $\delta$ is the difference between the first estimated value of the threshold voltage of the second insulated gate transistor and the threshold voltage of the first insulated gate transistor, $V_{gtLo}$ is the first gate overdrive, $dL^*$ is an X-intercept provided by extrapolation from the characteristic curve, f is the slope of the characteristic curve at the hypothetical point, $R_{sd}^*$ is the Y coordinate of the hypothetical point, and the prime denotes a first derivative with respect to $V_{gtLo}$.

Preferably, according to a fifteenth aspect of the present invention, in the insulated gate transistor characteristic evaluation device of the twelfth aspect, the threshold voltage determination means determines the optimum second to fourth estimated values which satisfy that the amount of change in the third estimated value equals the product of the amount of change in the second estimated value and the fourth estimated value when the first and second gate overdrives are slightly changed, using the relationship expressed by $$F(\delta, V_{gtLo}) = R^*(\delta, V_{gtLo}) - \frac{f(\delta, V_{gtLo})}{f'(\delta, V_{gtLo})} \cdot R^{*\prime}(\delta, V_{gtLo}) - R_{sd}^*(\delta, V_{gtLo})$$

where δ is the difference between the first estimated value of the threshold voltage of the second insulated gate transistor and the threshold voltage of the first insulated gate transistor, $V_{gtLo}$ is the first gate overdrive, R* is a Y-intercept provided by extrapolation from the characteristic curve, f is the slope of the characteristic curve at the hypothetical point, $R_{sd}^*$ is the Y coordinate of the hypothetical point, and the prime denotes a first derivative with respect to $V_{gtLo}$.

Preferably, according to a sixteenth aspect of the present invention, in the insulated gate transistor characteristic evaluation device of the twelfth aspect, the threshold voltage determination means determines the optimum second to fourth estimated values which satisfy that the amount of change in the third estimated value equals the product of the amount of change in the second estimated value and the fourth estimated value when the first and second gate overdrives are slightly changed, using the relationship expressed by $$F(\delta, V_{gtLo}) = \frac{R^{*\prime}(\delta, V_{gtLo})}{f'(\delta, V_{gtLo})} + DL^*(\delta, V_{gtLo})$$

where δ is the difference between the first estimated value of the threshold voltage of the second insulated gate transistor and the threshold voltage of the first insulated gate transistor, $V_{gtLo}$ is the first gate overdrive, R* is a Y-intercept provided by extrapolation from the characteristic curve, f is the slope of the characteristic curve at the hypothetical point, DL* is the X coordinate of the hypothetical point, and the prime denotes a first derivative with respect to $V_{gtLo}$.

A seventeenth aspect of the present invention is intended for an insulated gate transistor characteristic evaluation device using at least two insulated gate transistors differing from each other only in mask channel length and including a first insulated gate transistor having a longer channel length and a second insulated gate transistor having a shorter channel length, the insulated gate transistor characteristic evaluation device for evaluating a characteristic of the second insulated gate transistor using a characteristic of the first insulated gate transistor as a reference. According to the present invention, the insulated gate transistor characteristic evaluation device comprises: threshold voltage estimation means for extracting a threshold voltage for the first insulated gate transistor to estimate a threshold voltage for the second insulated gate transistor to define the estimated value as a first estimated value; extraction means for extracting a hypothetical point at which a change in a total drain-to-source resistance is estimated to be approximately zero when a first gate overdrive and a second gate overdrive are slightly changed, based on a characteristic curve drawn in an X-Y plane with the mask channel length measured on an X-axis and the total drain-to-source resistance measured on a Y-axis, the characteristic curve indicating the relationship between the mask channel length of the first and second insulated gate transistors and the total drain-to-source resistance, the values of the mask channel length at the hypothetical point being defined as a second estimated value, the first gate overdrive being defined as the difference between the gate voltage of the first insulated gate transistor and the extracted threshold voltage of the first insulated gate transistor, the second gate overdrive being defined as the difference between the gate voltage of the second insulated gate transistor and the first estimated value; threshold voltage determination means for determining a first estimated value by the second estimated value, the first estimated value satisfying that a characteristic curve indicating the relationship between the second gate overdrive measured on an X-axis and the second estimated values measured on a Y-axis has a predetermined configuration in a predetermined range of the second gate overdrive, to determine the determined first estimated value as a true threshold voltage of the second insulated gate transistor; and channel length reduction determination means for determining the difference between the mask channel length and an effective channel length, and a series resistance, based on the true threshold voltage.

Preferably, according to an eighteenth aspect of the present invention, in the insulated gate transistor characteristic evaluation device of the seventeenth aspect, the threshold voltage determination means determines a standard deviation of the second estimated value in the predetermined range to detect the characteristic curve having the predetermined configuration.

According to a nineteenth aspect of the present invention, an insulated gate transistor characteristic evaluation device comprises: calculation means for extracting an effective channel length from each of at least two drain current versus gate voltage characteristics differing from each other in source-drain voltage, by using a resistance-based method; and output means for determining an effective channel length by extrapolation from the effective channel lengths extracted for different source-drain voltages.

A twentieth aspect of the present invention is intended or a computer readable recording medium storing therein a characteristic evaluation program and using at least two insulated gate transistors differing from each other only in mask channel length and including a first insulated gate transistor having a longer channel length and a second insulated gate transistor having a shorter channel length, the computer readable recording medium for causing a computer to evaluate a characteristic of the second insulated gate transistor using a characteristic of the first insulated gate transistor as a reference. According to the present invention, the computer readable recording medium comprises: means for causing the computer to extract a threshold voltage for the first insulated gate transistor to estimate a threshold voltage for the second insulated gate transistor to define the estimated value as a first estimated value; means for causing the computer to extract a hypothetical point at which a change in a total drain-to-source resistance is estimated to be approximately zero when a first gate overdrive and a second gate overdrive are slightly changed, based on a characteristic curve drawn in an X-Y plane with the mask channel length measured on an X-axis and the total drain-to-source resistance measured on a Y-axis, the characteristic curve indicating the relationship between the mask channel length of the first and second insulated gate transistors and the total drain-to-source resistance on the condition that the first and second gate overdrives are equal, the value of the mask channel length and the value of the total drain-to-source resistance at the hypothetical point being defined as second and third estimated values, respectively, the means also causing the computer to extract the slope of the characteristic curve at the hypothetical point to define the value of the slope as a fourth estimated value, the first gate overdrive being defined as the difference between the gate voltage of the first insulated gate transistor and the extracted threshold voltage of the first insulated gate transistor, the second gate overdrive being defined as the difference between the gate voltage of the second insulated gate transistor and the first estimated value; means for causing the computer to determine optimum second to fourth estimated values that are respective ones of the second to fourth estimated values which satisfy that the amount of change in the third estimated value equals the product of the amount of change in the second estimated value and the fourth estimated value when the first and second gate overdrives are slightly changed, to determine an optimum first estimated value associated with the optimum second to fourth estimated values, thereby to determine a true threshold voltage of the second insulated gate transistor based on the optimum first estimated value; and means for causing the computer to determine the difference between the mask channel length and an effective channel length, and a series resistance, based on the true threshold voltage.

An twenty-first aspect of the present invention is intended for a computer readable recording medium storing therein a characteristic evaluation program and using at least two insulated gate transistors differing from each other only in mask channel length and including a first insulated gate transistor having a longer channel length and a second insulated gate transistor having a shorter channel length, the computer readable recording medium for causing a computer to evaluate a characteristic of the second insulated gate transistor using a characteristic of the first insulated gate transistor as a reference. According to the present invention, the computer readable recording medium comprises: means for causing the computer to extract a threshold voltage for the first insulated gate transistor to estimate a threshold voltage for the second insulated gate transistor to define the estimated value as a first estimated value; means for causing the computer to extract a hypothetical point at which a change in a total drain-to-source resistance is estimated to be approximately zero when a first gate overdrive and a second gate overdrive are slightly changed, based on a characteristic curve drawn in an X-Y plane with the mask channel length measured on an X-axis and the total drain-to-source resistance measured on a Y-axis, the characteristic curve indicating the relationship between the mask channel length of the first and second insulated gate transistors and the total drain-to-source resistance on the condition that the first and second gate overdrives are equal, the value of the mask channel length at the hypothetical point being defined as a second estimated value, the first gate overdrive being defined as the difference between the gate voltage of the first insulated gate transistor and the extracted threshold voltage of the first insulated gate transistor, the second gate overdrive being defined as the difference between the gate voltage of the second insulated gate transistor and the first estimated value; means for causing the computer to determine a first estimated value by the second estimated value, the first estimated value satisfying that a characteristic curve indicating the relationship between the second gate overdrive measured on an X-axis and the second estimated value measured on a Y-axis has a predetermined configuration in a predetermined range of the second gate overdrive, to determine the determined first estimated value as a true threshold voltage of the second insulated gate transistor; and means for causing the computer to determine the difference between the mask channel length and an effective channel length, and a series resistance, based on the true threshold voltage.

As above described, the method of evaluating the characteristic of the insulated gate transistor according to the first and seventh aspects of the present invention, the insulated gate transistor characteristic evaluation device according to the eleventh and seventeenth aspects of the present invention and the computer readable recording medium storing therein the characteristic evaluation program according to the twentieth and twenty-first aspects of the present invention may accurately extract the threshold voltage of the second insulated gate transistor independently of the range of the second gate overdrive to increase the extraction accuracy of the effective channel length and the series resistance.

The method of evaluating the characteristic of the insulated gate transistor according to the second aspect of the present invention and the insulated gate transistor characteristic evaluation device according to the twelfth aspect of the present invention approximate the characteristic curve using the line. Then, the hypothetical point may be determined as a point of intersection of lines, and the slope at the point of intersection may be determined as the slope of the lines. This is effective in facilitating the extraction of the hypothetical point and the slope at the hypothetical point.

The method of evaluating the characteristic of the insulated gate transistor according to the third to sixth aspects of the present invention and the insulated gate transistor characteristic evaluation device according to the thirteenth to sixteenth aspects of the present invention need not determine a derivative of the coordinates of the hypothetical point with respect to the gate overdrive. This might reduce errors since the coordinate of the point of intersection determined from the characteristic curve are more significantly influenced by noises than are the Y- and X-intercepts of the characteristic curve. Thus, the derivative of the coordinates of the hypothetical point with respect to the gate overdrive has a greater error than does the derivative of the intercepts.

The method of evaluating the characteristic of the insulated gate transistor according to the eighth aspect of the present invention and the insulated gate transistor characteristic evaluation device according to the eighteenth aspect of the present invention facilitate the detection of the characteristic curve having the predetermined configuration to readily increase the speed of the characteristic evaluation.

The method of evaluating the characteristic of the insulated gate transistor according to the ninth aspect of the present invention and the insulated gate transistor characteristic evaluation device according to the nineteenth aspect of the present invention may eliminate errors resulting from drift velocity saturation to increase the extraction accuracy.

The method of fabricating the insulated gate transistor according to the tenth aspect of the present invention may extract the threshold voltage and the effective channel length with high accuracy and in a non-destructive manner using the method of evaluating the characteristic of the insulated gate transistor, thereby to reduce the time required for the fabrication.

It is therefore an object of the present invention to provide a resistance-based method which extracts an effective channel length and a series resistance with increased accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 16 is a graph for illustrating the determination of a channel length reduction according to the second preferred embodiment;

FIG. 33 is a graph showing an example of the dependence of the channel length reduction upon the channel length in the S&R method.

DESCRIPTION OF THE PREFERRED EMBODIMENTS

Figure 1:
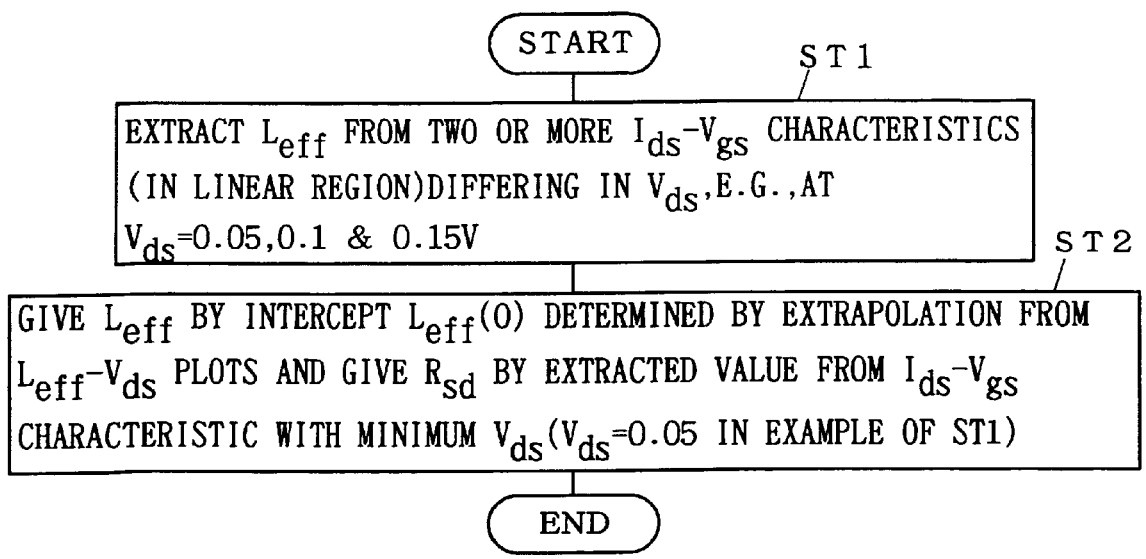
FIG. 1 is a flowchart for illustrating the outline of the present invention.
Figure 2:
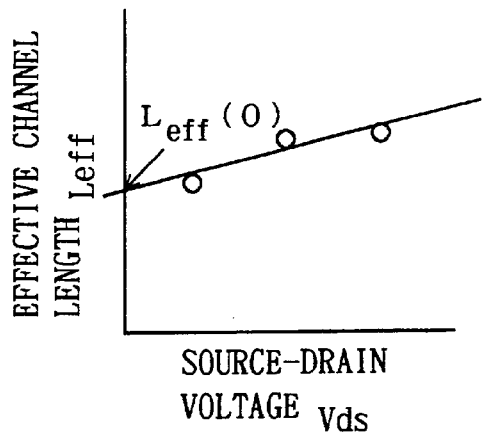
FIG. 2 conceptually illustrates one step of FIG. 1.

The outline of a method of evaluating a characteristic of an insulated gate transistor according to the present invention will now be described with reference to FIGS. 1 and 2. FIG. 1 is a flowchart showing the outline of the procedure of the method of evaluating the characteristic of the insulated gate transistor according to the present invention. The insulated gate transistor used herein shall be a MOS transistor. Two ore more MOS transistors are prepared which are equal in mask channel width $W_m$ but differ in mask channel length $L_m$. An effective channel length $L_{eff}$ for these MOS transistors is extracted from two or more drain-source current versus gate voltage characteristics ($I_{ds}$-$V_{gs}$ characteristics) having different drain-source voltages $V_{ds}$ (step ST1). This extraction is performed using a linear region of the $I_{ds}$-$V_{gs}$ characteristics. For example, with the drain-source voltage $V_{ds}$ set to 0.05 V, 0.1 V and 0.15 V, the respective effective channel lengths $L_{eff}$ are extracted.

The value of the effective channel length $L_{eff}$ is provided by extrapolation from the relationship between the effective channel length $L_{eff}$ and the source-drain voltage $V_{ds}$. For instance, the value of an intercept, that is, $L_{eff}(0)$ in the graph shown in FIG. 2 depicting the relationship between the effective channel length $L_{eff}$ and the source-drain voltage $V_{ds}$ is defined as the effective channel length $L_{eff}$ (step ST2). A series resistance $R_{sd}$ is given by extraction from the $I_{ds}$-$V_{gs}$ characteristics when the source-drain voltage $V_{ds}$ has a minimum value. The value of the series resistance $R_{sd}$ may be determined by the extrapolation using the relationship between the effective channel length $L_{eff}$ and the source-drain voltage $V_{ds}$ in a manner similar to the determination of the effective channel length $L_{eff}$.

First Preferred Embodiment

The method of evaluating the characteristic of the insulated gate transistor according to a first preferred embodiment of the present invention will be described hereinafter. In the method of evaluating the characteristic of the insulated gate transistor according to the first preferred embodiment, a channel length reduction DL and the series resistance $R_{sd}$ are extracted using the drain current in a linear region of two transistors which are equal in mask channel width $W_m$ but differ in mask channel length $L_m$.

Figure 28:
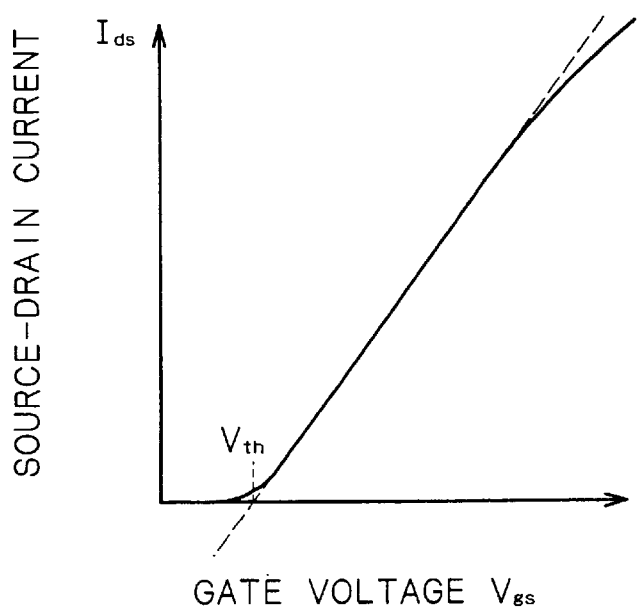
FIG. 28 is a graph for illustrating the extraction of the threshold voltage.
Figure 29:
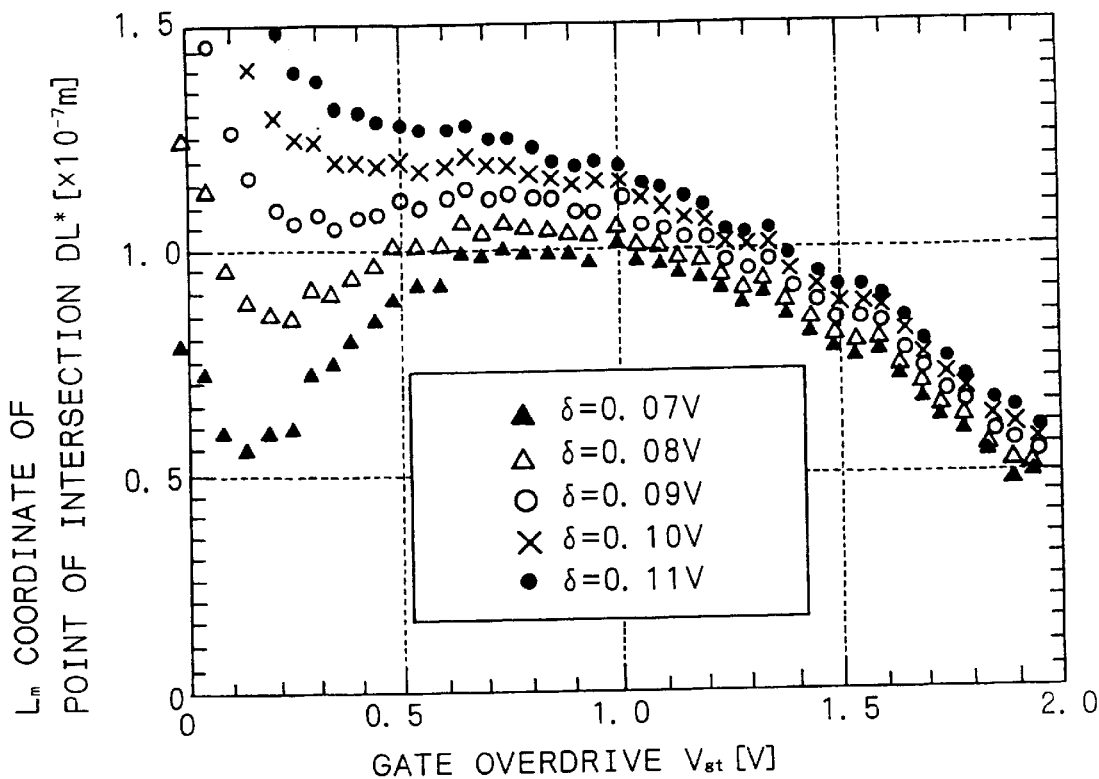
FIG. 29 is a graph for illustrating an error caused by the TMC method due to the uncertainty of the threshold voltage.
Figure 30:
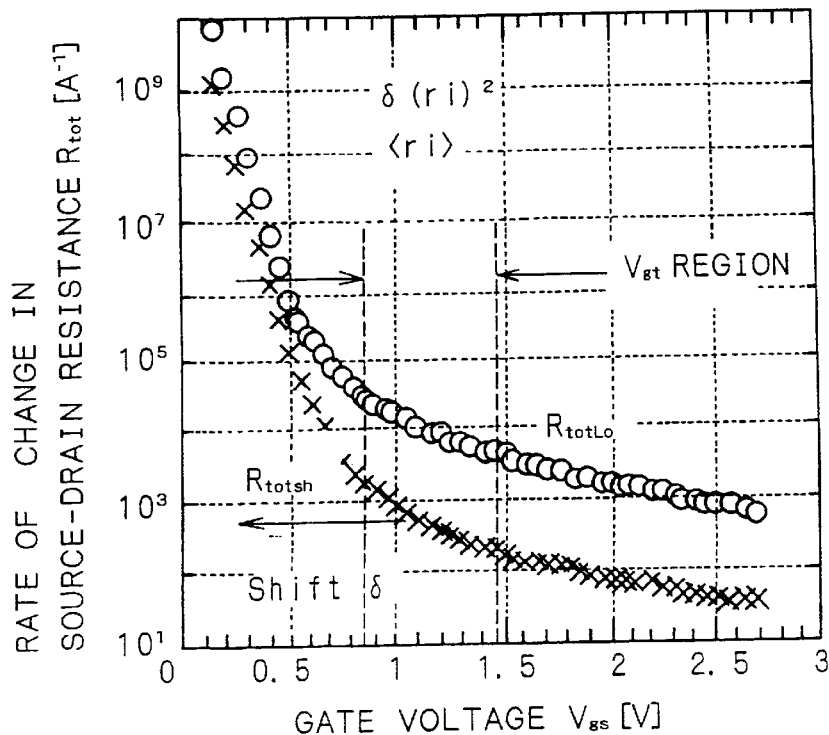
FIG. 30 is a graph for illustrating the calculation of a standard deviation in the S&R method.
Figure 31:
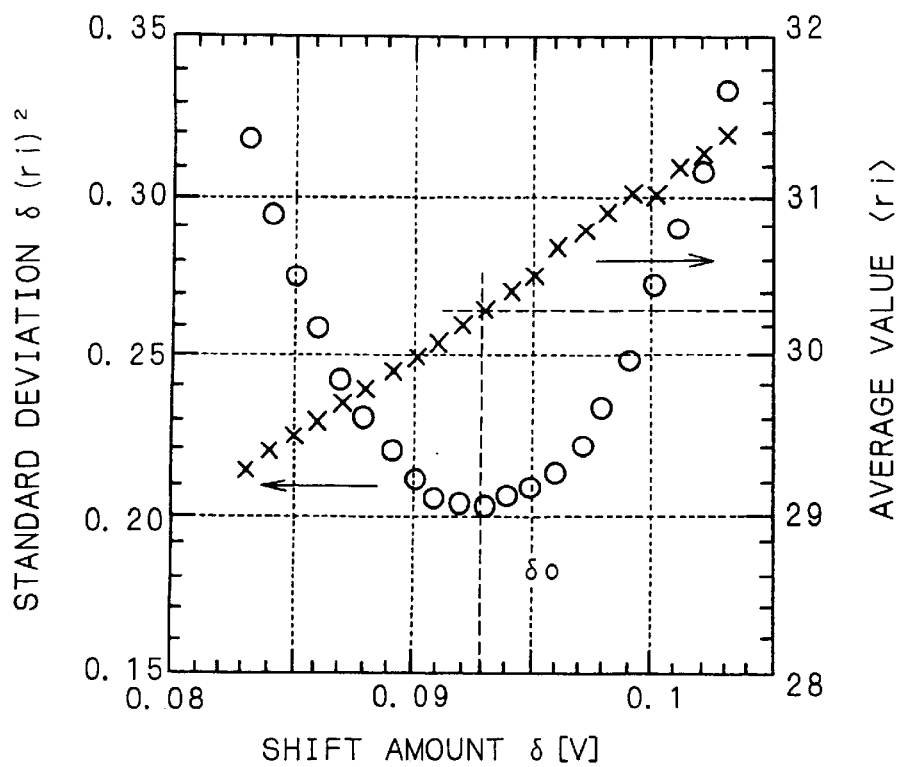
FIG. 31 is a graph for illustrating the determination of the true shift amount in the S&R method.
Figure 32:
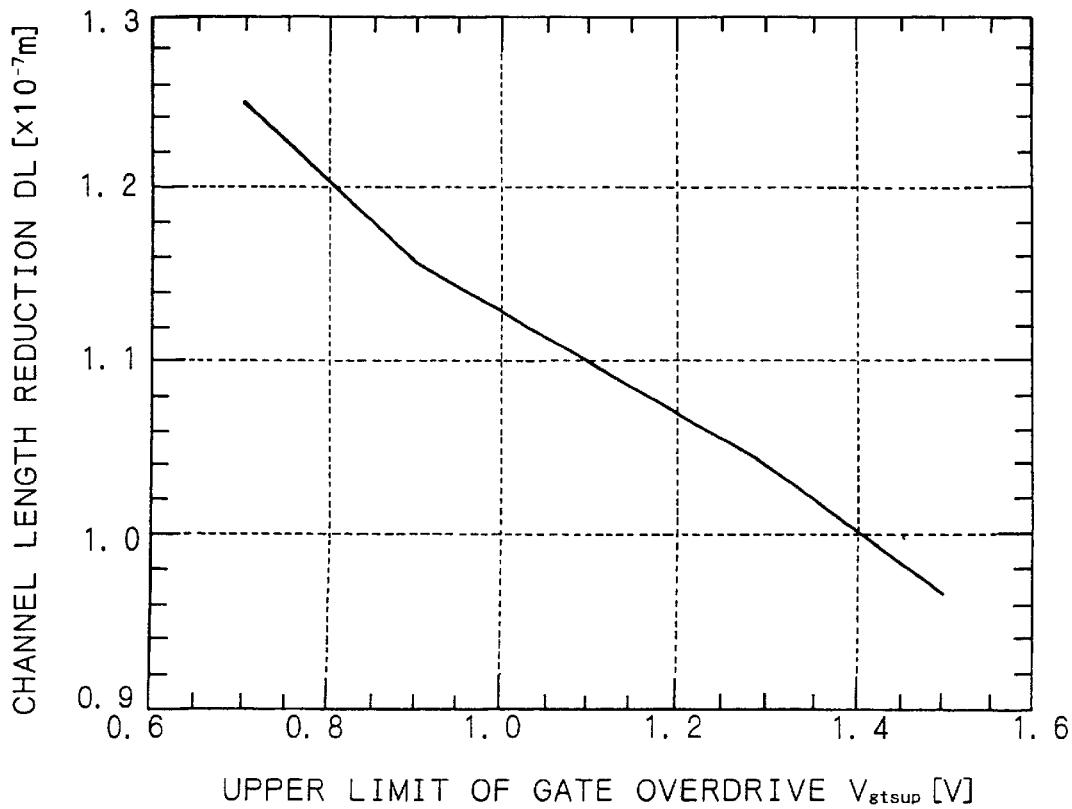
FIG. 32 is a graph showing an example of the dependence of the channel length reduction upon an upper limit of a gate overdrive region in the S&R method.

The step ST1 shown in FIG. 1 in the method of evaluating the characteristic of the insulated gate transistor according to the first preferred embodiment will be briefly described below. In the method of the first preferred embodiment, two MOS transistors which are equal in mask channel width $W_m$ but differ in mask channel length $L_m$ are prepared. One of the two MOS transistors which has a longer mask channel length $L_m$ is referred to hereinafter as a long transistor Lo or a first insulated gate transistor, and the other MOS transistor having a shorter mask channel length $L_m$ is referred to hereinafter as a short transistor Sh or a second insulated gate transistor. The threshold voltages $V_{thLo}$ and $V_{thSh}$ of the MOS transistors Lo and Sh are extrapolated, for example, from the $I_{ds}$-$V_{gs}$ characteristics in the conventional manner described with reference to FIG. 28. The threshold voltage $V_{thSh}$ of the second insulated gate transistor obtained at this time by the extrapolation is a first estimated value.

With the threshold voltage $V_{thLo}$ of the long transistor Lo fixed, the threshold voltage $V_{thSh}$ (the first estimated value) of the short transistor Sh is changed. Then, coordinates (DL*, $R_{sd}$*) of hypothetical points at which changes in the value of a total drain-to-source resistance $R_{tot}$ is estimated to be approximately zero if a gate overdrive $V_{gt}$ is slightly changed for the changed values of the threshold voltage $V_{thSh}$ are extracted using the coordinates of points of intersection, for example. At this time, the gate overdrive $V_{gt}$ of the long transistor Lo is a first gate overdrive, and the gate overdrive $V_{gt}$ of the short transistor Sh is a second gate overdrive. The values of the coordinate DL* of the hypothetical points are second estimated values, the values of the coordinate $R_{sd}$* thereof are third estimated values, and the values of the slope f at the hypothetical points are fourth estimated values.

Figure 25:
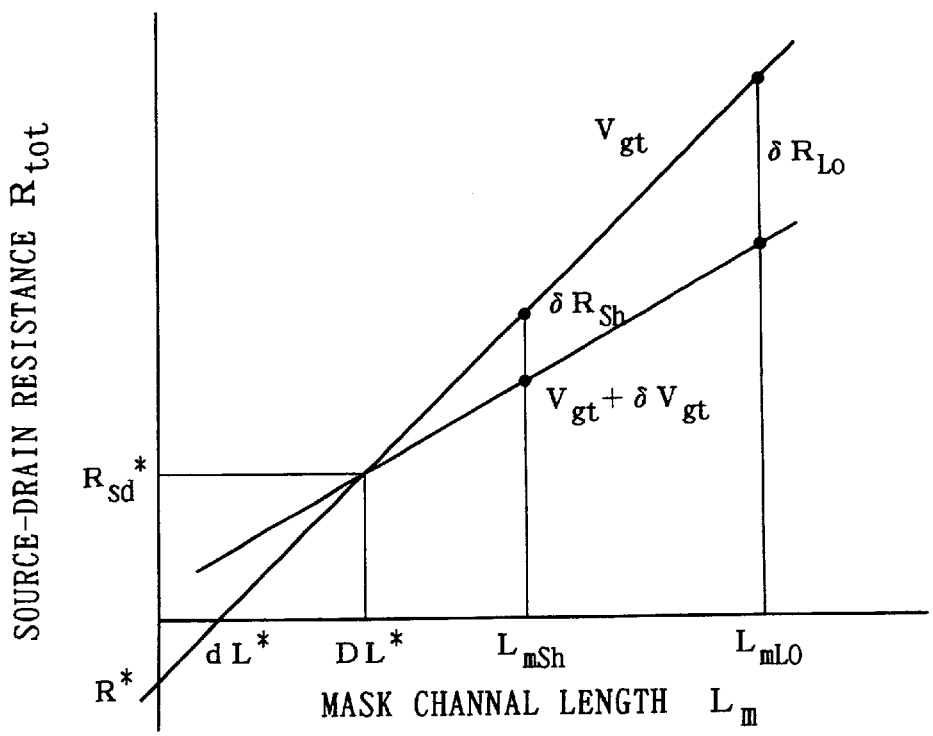
FIG. 25 is a graph showing the relationship which approximately holds between a total drain-to-source resistance and the mask channel length.
Figure 26:
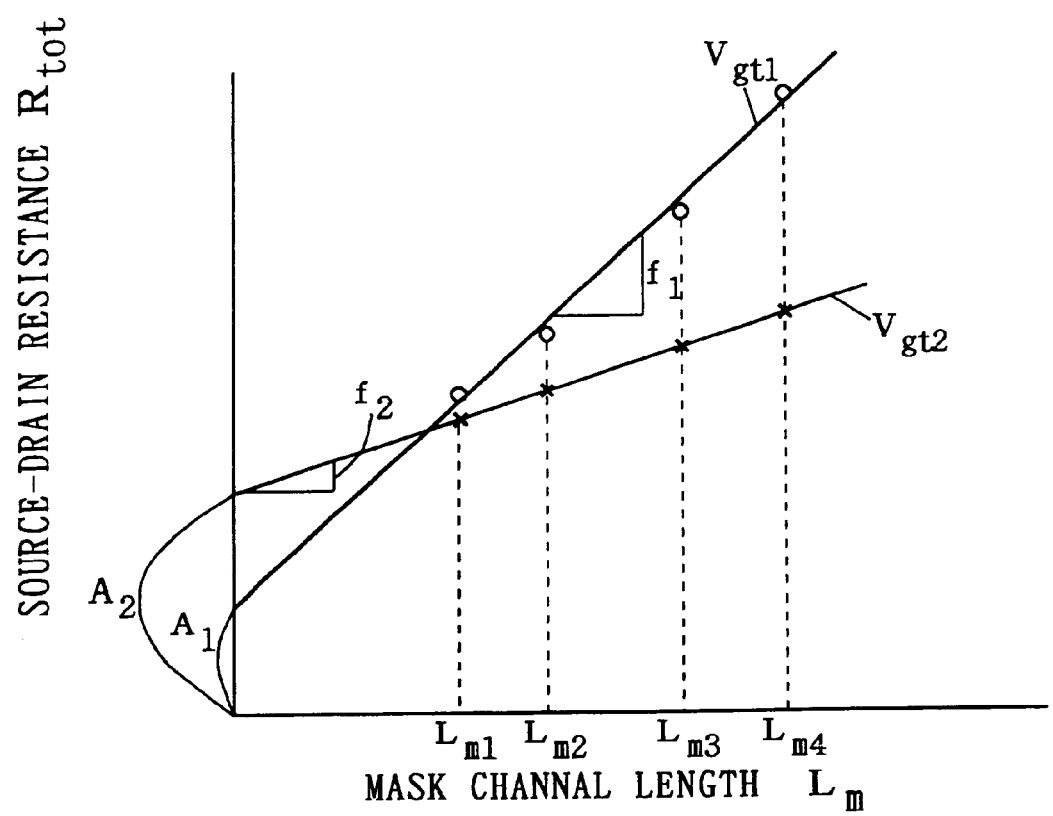
FIGS. 26 and 27 are graphs for illustrating the extraction of the effective channel length in the TMC method.
Figure 27:
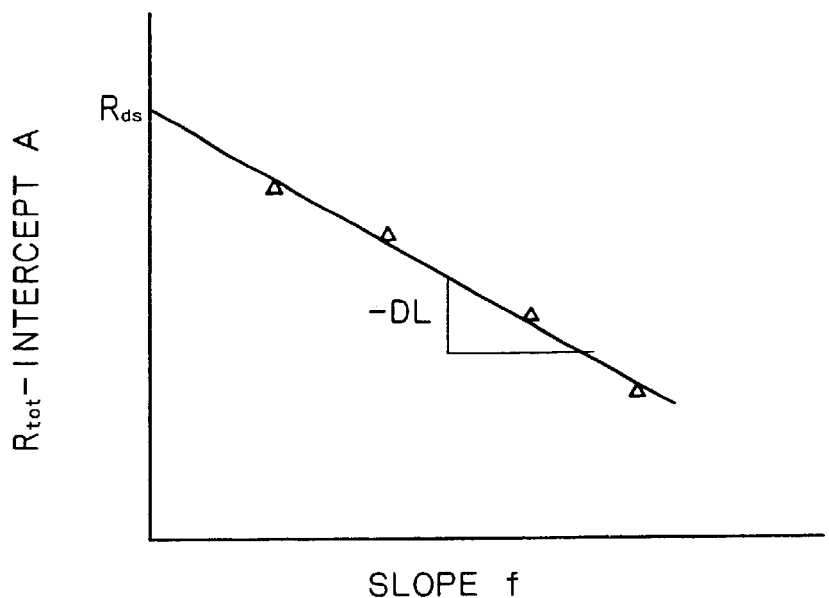

Using the threshold voltages $V_{thLo}$ and $V_{thSh}$, the coordinates (DL*, $R_{sd}$*) of the hypothetical point are extracted from the relationship between the total drain-to-source resistance $R_{tot}$ and the mask channel length $L_m$. An example of the method of extracting the hypothetical point from the relationship between the total drain-to-source resistance $R_{tot}$ and the mask channel length $L_m$ includes, for example, a conventional method of extracting the point of intersection of two $R_{tot}$-$L_m$ characteristic curves (lines) drawn in the graph shown in FIG. 25, that is, the graph showing the mask channel length $L_m$ on the X-axis versus the total drain-to-source resistance $R_{tot}$ on the Y-axis. For instance, in FIG. 25, the line indicative of the gate overdrive $V_{gt}$ is a first line, a point which satisfies the mask channel length $L_m$=$L_{mLo}$ on the first line is a first point, and a point which satisfies the mask channel length $L_m$=$L_{mSh}$ on the first line is a second point. However, the estimation of the coordinate of the hypothetical point is not limited to the above described method. For example, a curve determined by three or more points, rather than the line passing through two points, may be used for the estimation, and a point adjacent to the point of intersection may be used in place of the point of intersection. Among the extracted coordinates (DL*, $R_{sd}$*) of the hypothetical points are determined those of a hypothetical point estimated to satisfy that the product of the channel resistance f per unit length and the X coordinate component of the hypothetical point, that is, the amount of change in the mask channel length $L_m$ coordinate value DL* is equal to the Y coordinate component of the hypothetical point, that is, the amount of change in the total drain-to-source resistance $R_{tot}$ coordinate value $R_{sd}$* of the hypothetical point.

Next, the step ST1 of FIG. 1, that is, the step of extracting the effective channel length $L_{eff}$ and the series resistance $R_{sd}$ of the MOS transistor for the respective values of the drain-source voltages $V_{ds}$ is described in detail with reference to FIG. 3. First, the $I_{ds}$-$V_{gs}$ characteristics of the two transistors Lo and Sh which are equal in mask channel width $W_m$ but differ in mask channel length $L_m$ are measured (step ST1.1).

The threshold voltages $V_{thLo}$ and $V_{thSh}$ of the long and short transistors Lo and Sh are extracted by the extrapolation and the like from the measured $I_{ds}$-$V_{gs}$ characteristics (step ST1.2). The difference ($V_{thSh}$-$V_{thLo}$) between the threshold voltages $V_{thLo}$ and $V_{thSh}$ is calculated. The difference ($V_{thSh}$-$V_{thLo}$) between the threshold voltages $V_{thLo}$ and $V_{thSh}$ calculated in this manner is designated hereinafter by $\delta_{guess}$.

The lower and upper limits of a range in which a value $\delta$ defined as the threshold voltage difference falls are determined as $\delta_{inf}$=$\delta_{guess}$-K and $\delta_{sup}$=$\delta_{guess}$+K, respectively, (step ST1.3) where K equals 0.2 V, for example. The initial value $\delta$=$\delta_{inf}$ is set.

Whether or not the value $\delta$ to be calculated is between $\delta_{inf}$ and $\delta_{sup}$ is judged (step ST1.4). That is, whether or not $\delta_{inf} \leq \delta \leq \delta_{sup}$ is judged.

The threshold voltage $V_{thLo}$ of the long transistor Lo is fixed at the value extracted in the step ST1.2. The threshold voltage $V_{thSh}$ of the short transistor Sh is assumed to be the sum of the value $\delta$ and the threshold voltage $V_{thLo}$ of the long transistor Lo (step ST1.5).

The gate overdrive $V_{gt}$ is measured on the basis of the threshold voltages $V_{thLo}$) and $V_{thLo}$ +$\delta$ provided in the step ST1.5. The rates of change $DL^{*'}(\delta, V_{gtn})$ in the $L_m$ coordinate value of about 20 hypothetical points, the rates of change $R_{sd}^{*'}(\delta, V_{gtn})$ in the $R_{tot}$ coordinate values thereof, and the channel resistances $f(\delta, V_{gtn})$ per unit length thereof are determined in a given region $\Omega$, for example, a range of the gate overdrive $V_{gt}$ satisfying 0.3 V$\leq V_{gt} \leq$1.3 V. From the determined values are calculated the values of a function $F(\delta, V_{gtn})$ expressed by $$F(\delta, V_{gtn})=R_{sd}^{*'}-f \cdot DL^{*'} \quad (6)$$

where n=1, 2, . . . , 20

Next, a standard deviation $\delta[F(\delta)]$ of the function F is calculated in the region $\Omega$ (step ST1.7). The value of the shift amount $\delta$ is changed by substituting $\delta$+Q for $\delta$, and the flow returns to the step ST1.4 (step ST1.8).

The steps ST1.5 to ST1.8 are repeated if it is judged in the step ST1.4 that $\delta_{inf} \leq \delta \leq \delta_{sup}$. If it is not judged in the step ST1.4 that $\delta_{inf} \leq \delta \leq \delta_{sup}$, the flow proceeds to the step ST1.9. In the step ST1.9, $\delta$=$\delta$0 which minimizes the standard deviation $\delta[F(\delta)]$ is determined. At that time, the true threshold voltage $V_{thSh}$ of the short transistor Sh is the sum of the threshold voltage $V_{thLo}$ of the long transistor Lo and $\delta$0 determined in the step ST1.9.

Using the true threshold voltage $V_{thLo}$+$\delta$0 of the short transistor Sh which is determined in the step ST1.9, the gate overdrive $V_{gt}$ of the short transistor Sh is measured to determine the values of the $L_m$ coordinate $DL^*(V_{gt})$ of the hypothetical points (step ST1.10). It should be noted that the threshold voltage $V_{thLo}$ of the long transistor Lo at this time is based on the value determined in the step ST1.2 as in the step ST1.5.

The $L_m$ coordinate value DL* of a hypothetical point at a stationary point closest to the point at which the gate overdrive $V_{gt}$=0 is determined as the true channel length reduction DL (step ST1.11). The true channel length reduction DL is an optimum second estimated value. At the same time, the effective channel length $L_{eff}$ is determined by the difference between the mask channel length $L_m$ and the true channel length reduction DL, and the series resistance $R_{sd}$ which is an optimum third estimated value is determined by $$R_{sd}(V_{gt})=R_{totLo}(V_{gt})-(L_{mLo}-DL) \cdot f(\delta 0, V_{gt}) \quad (7)$$

where $R_{totLo}$ is the total drain-to-source resistance of the long transistor Lo, and $L_{mLo}$ is the mask channel length of the long transistor Lo. An optimum fourth estimated value is the channel resistance f per unit length obtained using the gate overdrive $V_{gt}$ which gives the true channel length reduction DL.

The specific procedure of the determination of the true channel length reduction DL and the like from the standard deviation of the function F given in Expression (6) is described below. The method of evaluating the characteristic of the insulated gate transistor according to the first preferred embodiment employs a variational method particularly to reduce an error resulting from the uncertainty of the extrapolation of the threshold voltage, particularly the uncertainty of the extrapolation of the threshold voltage of a transistor having a short channel length, with attention focused on the relationship given in Expression (8) which holds between the values of the $L_m$ coordinate $DL^*$ of the hypothetical point and $dL^*$, for example.

$$dL^* + \frac{f}{f'} \cdot dL^{*\prime} - DL^* = 0 \tag{8}$$

where $dL^*$ is the value of an X-intercept provided by the extrapolation from an $R_{tot-Lm}$ characteristic curve (line) drawn in a graph showing the relationship between the total drain-to-source resistance $R_{tot}$ on the Y-axis and the mask channel length $L_m$ on the X-axis. The value $dL^*$ is referred to hereinafter as an $L_m$-intercept value.

It is assumed that the threshold voltage difference between the short transistor Sh and the long transistor Lo is the shift amount $\delta$. The $L_m$ coordinate value $DL^*$ of the hypothetical point the $L_m$-intercept value $dL^*$, the rate of change $dL^{*\prime}$ thereof, the channel resistance f per unit length, and the rate of change f thereof are determined from $R_{totSh}(V_{gtLo}+\delta-V_{thSh}+V_{thLo})$ and $R_{totLo}(V_{gtLo})$. Expression (8) is satisfied when the shift amount $\delta$ equals the true threshold voltage difference $\delta 0$ between the short transistor Sh and the long transistor Lo. At that time, the $L_m$ coordinate value $DL^*$ of a hypothetical point at which the threshold voltage $V_{thLo}$ is close to zero provides the true channel length reduction DL. Therefore, the true channel length reduction DL and the series resistance $R_{sd}$ may be extracted in a procedure to be described below.

Initially, the $L_m$ coordinate value $DL^*$ of the hypothetical point, the $L_m$-intercept value $dL^*$, and the channel resistance f per unit length are provided for a given shift amount $\delta$ by $$DL^*(\delta, V_{gtLo}) = \left(L_{mSh} - \frac{\delta R_{totSh}}{\delta R_{totLo}} \cdot L_{mLo}\right) \cdot \left(1 - \frac{\delta R_{totSh}}{\delta R_{totLo}}\right)^{-1} \tag{9}$$

$$dL^*(\delta, V_{gtLo}) = \left(L_{mSh} - \frac{R_{totSh}}{R_{totLo}} \cdot L_{mLo}\right) \cdot \left(1 - \frac{R_{totSh}}{R_{totLo}}\right)^{-1} \tag{10}$$

$$f(\delta, V_{gtLo}) = \frac{R_{totLo} - R_{totSh}}{L_{mLo} - L_{mSh}} \tag{11}$$

The parameters $R_{totSh}$, $R_{totLo}$, $\delta R_{totSh}$ and $\delta R_{totLo}$ used in Expressions (9) to (11) are determined by $$R_{totSh}=R_{totSh}(V_{gtLo}+\delta-V_{thSh}+V_{thLo}) \tag{12}$$

$$R_{totLo}=R_{totLo}(V_{gtLo}) \tag{13}$$

$$\delta R_{totSh} = R_{totSh}\left(V_{gtLo} + \delta - V_{thSh} + V_{thLo} - \frac{\delta V_{gt}}{2}\right) - R_{totSh}\left(V_{gtLo} + \delta - V_{thSh} + V_{thLo} + \frac{\delta V_{gt}}{2}\right) \tag{14}$$

$$\delta R_{totLo} = R_{totLo}\left(V_{gtLo} - \frac{\delta V_{gt}}{2}\right) - R_{totLo}\left(V_{gtLo} + \frac{\delta V_{gt}}{2}\right) \tag{15}$$

The $L_m$ coordinate value $DL^*$ of the hypothetical point, the $L_m$-intercept value $dL^*$, the rate of change $dL^{*\prime}$ thereof, the channel resistance f per unit length, and the rate of change f thereof are determined, with the shift amount $\delta$ changed.

The function F given in Expression (6), when transformed and redefined into $$F(\delta, V_{gtLo}) = \tag{16}$$
$$dL^*(\delta, V_{gtLo}) + \frac{f(\delta, V_{gtLo})}{f'(\delta, V_{gtLo})} \cdot dL^{*\prime}(\delta, V_{gtLo}) - DL^*(\delta, V_{gtLo})$$

is easier to determine. The function F defined in Expression (16) equals zero independently of the gate overdrive $V_{gtLo}$ when the shift amount $\delta$ equals the threshold voltage difference $\delta 0$ between the two transistors Lo and Sh. Then, the shift amount $\delta$ which minimizes the standard deviation of the function F in a given region of the gate overdrive $V_{gtLo}$ is determined as the true threshold voltage difference $\delta 0$.

Figure 4:
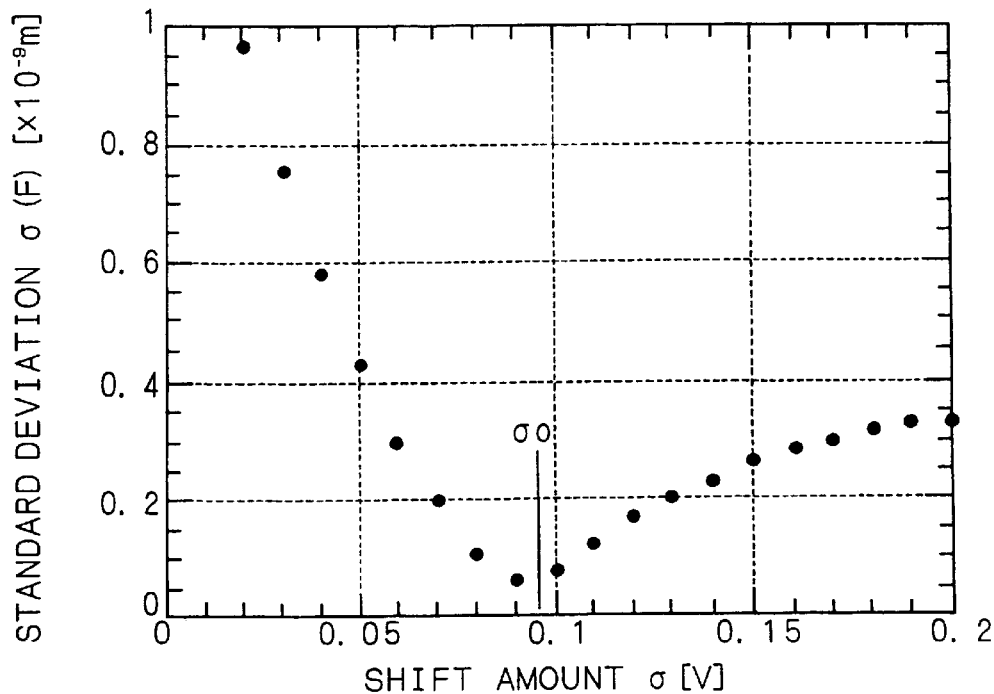
FIG. 4 is a graph for illustrating the determination of a true shift amount.

FIG. 4 is a graph showing a relationship between the standard deviation of the function F and the shift amount $\delta$. In the graph of FIG. 4, since the standard deviation of the function F is a minimum when the shift amount $\delta$ is 0.095 V, the true threshold voltage difference $\delta 0$ is set at 0.095 V.

The value of the true channel length reduction DL is determined using the value of the above-mentioned threshold voltage difference $\delta 0$. For example, the value of the true channel length reduction DL may be determined in the manner performed in the step ST1.11 of FIG. 3. Otherwise, the average of the $L_m$ coordinate values $DL^*(\delta 0, V_{gtLo})$ of the hypothetical points at which the gate overdrive $V_{gtLo}$ of the long transistor Lo is close to zero may be determined as the true channel length reduction DL. Using the effective channel length $L_{effSh}$ calculated from the true channel length reduction DL, the series resistance $R_{sd}$ is determined by $$R_{totSh}(V_{gt})=L_{effSh}(V_{gt}) \cdot f(V_{gt}) + R_{sd}(V_{gt}) \tag{17}$$

Figure 5:
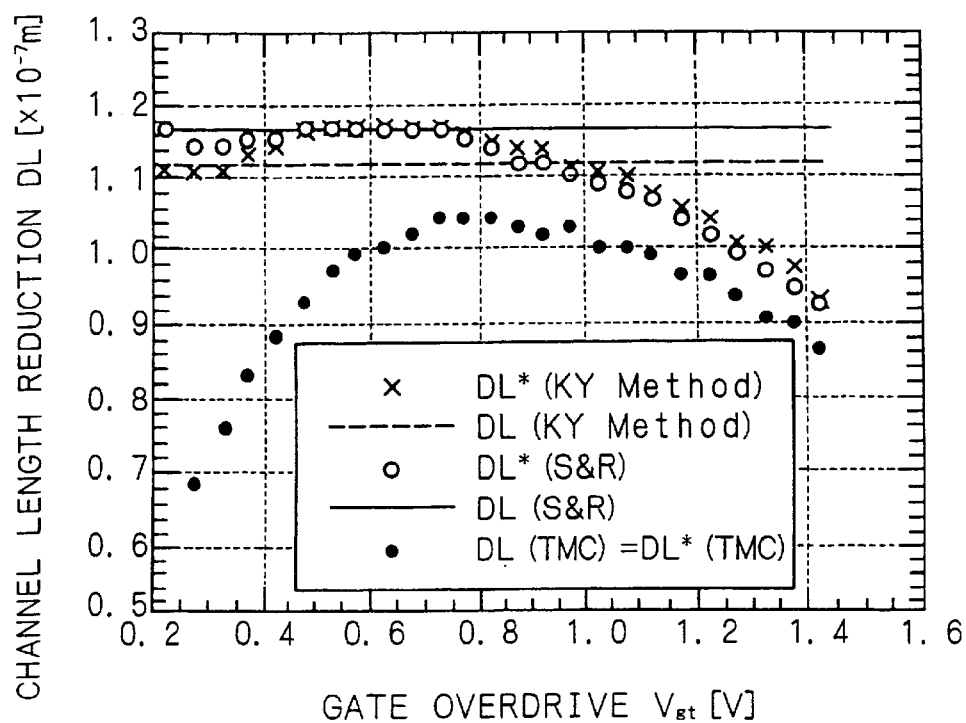
FIG. 5 is a graph for illustrating an effect of the first preferred embodiment.
Figure 6:
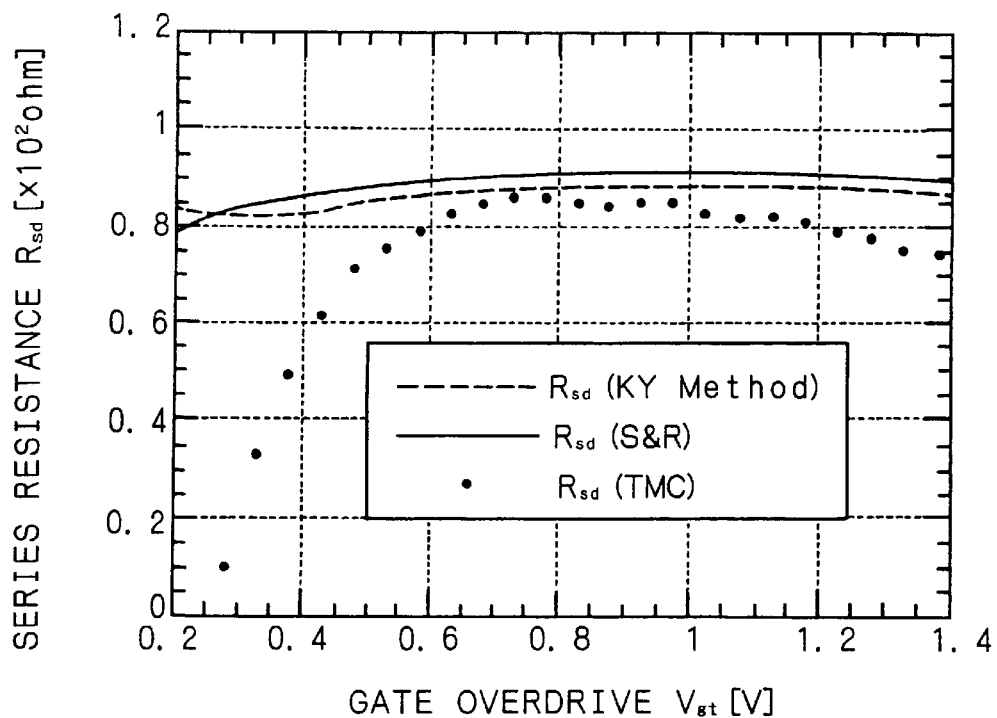
FIG. 6 is a graph for illustrating another effect of the first preferred embodiment.
Figure 7:
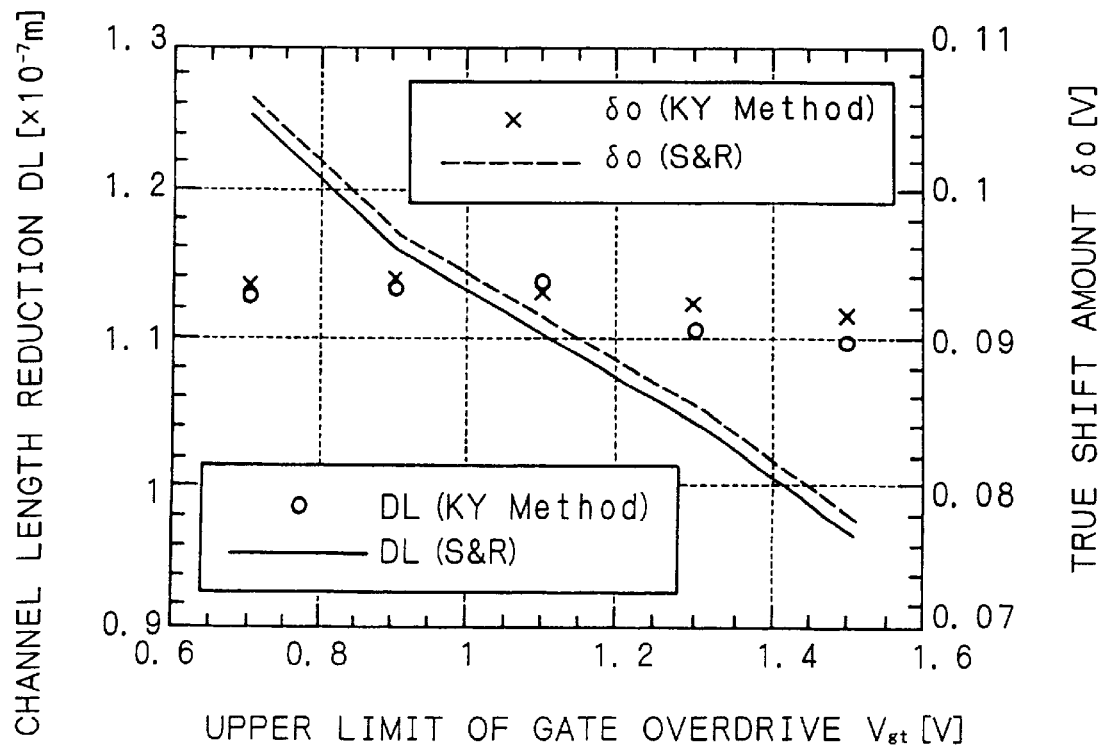
FIG. 7 is a graph for illustrating still another effect of the first preferred embodiment.

FIGS. 5 to 7 show examples of results of the method of evaluating the characteristic of the MOS transistor according to the first preferred embodiment (referred to hereinafter as a KY method), the S&R method and the TMC method which are applied to a process for fabricating a MOS transistor with a pattern width of 0.3 $\mu$m. FIGS. 5 and 6 suggest that the channel length reduction DL and the series resistance $R_{sd}$ extracted by the TMC method are significantly different from those extracted by the other methods (S&R and KY methods) because of the uncertainty of the threshold voltage $V_{th}$. FIG. 7 shows that the channel length reduction DL extracted by the S&R method is significantly dependent upon the region of the gate overdrive $V_{gt}$ which is set for calculation. The channel length reduction DL extracted by the KY method is stable and is not dependent upon the region of the gate overdrive $V_{gt}$ which is set for calculation, as compared with those extracted by the TMC and S&R methods.

The relationship between the KY method and the S&R method can be explicitly shown. The $L_m$ coordinate values $DL^*$ of the hypothetical points determined from the two transistors Sh and Lo which differ in mask channel length $L_m$ are given by Expression (10). At a limit as $\delta$ $V_{gt}$ approaches zero, Expression (18) holds.

$$\frac{\delta R_{totSh}}{\delta R_{totLo}} = \frac{dR_{totSh}}{dR_{totLo}} = \frac{R'_{totSh}}{R'_{totLo}} \equiv \frac{1}{ri} \quad (18)$$

Substituting Expression (18) into Expression (10) provides $$DL^* = DL^*[S\&R]\left(1 - \frac{1}{ri}\right)^{-1} \quad (19)$$

where $$DL^*[S\&R] \equiv L_{mSh} - \frac{L_{mLo}}{ri}$$

where [S&R] denotes a solution by the S&R method.

The $L_m$ coordinate value $DL^*$ given by Expression (19) differs by the amount of the correction term $(1-1/ri)^{-1}$ from the $L_m$ coordinate value $DL^*[S\&R]$ of the hypothetical point calculated by the S&R method which is disclosed in Y. Taur et al. "A New "Shift and Ratio" Method for MOSFET Channel-Length Extraction," IEEE Elect. Div. Lett, EDL-13(5), p. 267, 1992 (referred to hereinafter as Reference (1)) where [S&R] denotes a solution obtained by the S&R method. The difference results from the fact that the technique disclosed in Reference (1) neglects the rate of change DL'in the channel length reduction and the rate of change $R_{sd}$'in the series resistance with respect to the changes in the gate overdrive $V_{gt}$ when the $L_m$ coordinate value $DL^*[S\&R]$ is derived. Without such neglect, the result given in Expression (12) is obtained.

If the mask channel length $L_{mSh}$ of the short transistor Sh is sufficiently small relative to the mask channel length $L_{mLo}$ of the long transistor Lo, the $L_m$ coordinate value $DL^*[S\&R]$ of the hypothetical point determined by the S&R method asymptotically approaches the $L_m$ coordinate value $DL^*$ determined by the KY method. However, there are two differences between the KY method and the S&R method, which allow the KY method to provide a more consistent result than does the S&R method. One of the differences is a difference in method of determining the difference $\delta 0$ in threshold voltage $V_{th}$ between the two transistors. The S&R method assumes that, when the gate overdrive $V_{gt}$ is small, the $L_m$ coordinate values $DL^*[S\&R]$ of the hypothetical points have no gate overdrive dependence ($V_{gt}$-dependence). It is because the $L_m$ coordinate values $DL^*$ ($V_{gt}$) of the hypothetical points have a stationary point at or near $V_{gt}=0.7$ that the S&R method provides a suitable result in spite of the $V_{gt}$-dependence of the $L_m$ coordinate values $DL^*[S\&R]$. The second difference is a difference in interpretation of the channel length reduction DL. In the KY method, the extracted $L_m$ coordinate value $DL^*$ of the hypothetical point near $V_{gt}=0$ is defined as the true channel length reduction DL. The extractable well-defined amount in the resistance-based method is only the channel length reduction DL at $V_{gt}=0$.

The function F may be determined using any one of Expressions (20) to (22) in place of Expression (16) used in the first preferred embodiment.

$$F(\delta, V_{gtLo}) = \frac{f^2(\delta, V_{gtLo})}{f'(\delta, V_{gtLo})} \cdot dL^{*'}(\delta, V_{gtLo}) - R^*_{sd}(\delta, V_{gtLo}) \quad (20)$$

$$F(\delta, V_{gtLo}) = R^* - \frac{f(\delta, V_{gtLo})}{f'(\delta, V_{gtLo})} \cdot R^{*'}(\delta, V_{gtLo}) - R^*_{sd}(\delta, V_{gtLo}) \quad (21)$$

$$F(\delta, V_{gtLo}) = \frac{R^{*'}(\delta, V_{gtLo})}{f'(\delta, V_{gtLo})} + DL^*(\delta, V_{gtLo}) \quad (22)$$

The parameter $R^*$ in Expressions (21) and (22) denotes the value of an $R_{tot}$-intercept provided by the extrapolation from the $R_{tot-Lm}$ characteristics. The use of the Y-intercept $R^*$ or the X-intercept $dL^*$ provided at X=0 or Y=0 by the extrapolation from the $R_{tot}$-$L_m$ characteristic curve (line) drawn in a graph showing the relationship between the mask channel length $L_m$ on the X-axis and the total drain-to-source resistance $R_{tot}$ on the Y-axis may eliminate the need to differentiate the coordinates ($DL^*$, $R_{sd}^*$) of the hypothetical points. There is no difference in accuracy if any one of Expressions (16), and (20) to (22) is used, but $R_{sd}^*$ must be calculated if Expressions (20) and (21) are used. Thus, Expression (16) or (22) is preferably used.

Although the shift amount $\delta$ is determined by the minimum value of the standard deviation of the function F in the first preferred embodiment, the shift amount $\delta$ may be determined by the average value of the function F which is close to zero or by the minimum value of the sum of squares $\Sigma F^2$ of the function F. However, the final result determined by these determination methods, unlike the method using the minimum value of the standard deviation, sometimes contains an error resulting from an offset of the value of the function F due to calculation errors.

Further, although the channel length reduction DL is determined using the stationary point in the first preferred embodiment, the $L_m$ coordinate value $DL^*$ of a hypothetical point at which the gate overdrive $V_{gt}$ has a predetermined value close to zero may be defined as the channel length reduction DL. For example, the $L_m$ coordinate value $DL^*$ of a hypothetical point at which the gate overdrive $V_{gt}$ is 0.3 V is defined as the channel length reduction DL.

In the first preferred embodiment, the channel length reduction DL is determined by the $L_m$ coordinate value $DL^*$ of the hypothetical point at the stationary point. However, the average value of $DL^*$ in a predetermined range of the gate overdrive $V_{gt}$ may be defined as the channel length reduction DL. For example, the average value of $DL^*$ in a range of the gate overdrive $V_{gt}$ which satisfies $0.5 \leq V_{gt} \leq 1.0$ is defined as the channel length reduction DL.

Further, although the channel length reduction DL is determined by the $L_m$ coordinate value $DL^*$ of the hypothetical point at the stationary point in the first preferred embodiment, the maximum value of $DL^*$ may be defined as the channel length reduction DL. When the channel length reduction DL is determined by other methods, effects similar to those of the first preferred embodiment are provided.

Figure 8:
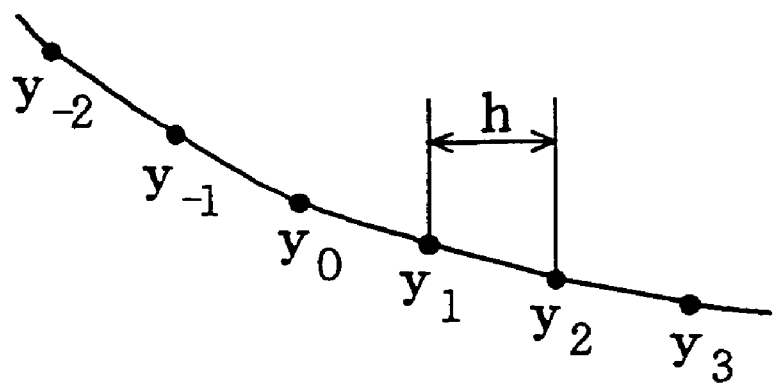
FIG. 8 illustrates a high-order approximation.

Furthermore, although $\delta R_{totSh}/\delta R_{totLo}$ is used in Expression (9) in the first preferred embodiment to determine the $L_m$ coordinate values $DL^*$ of the hypothetical points, $R_{totSh}'/R_{totLo}'$ may be used in place of $\delta R_{totSh}/\delta R_{totLo}$. That is, the calculation of the rate of change in the total drain-to-source resistance $R_{tot}$ of the long transistor Lo and the short transistor Sh with high accuracy using a high-order approximate formula allows the extraction of the channel length reduction DL with high accuracy. For example, when a curve is drawn through points $Y_{-2}$, $Y_{-1}$, $Y_0$, $y_1$, $y_2$ and $y_3$ equally spaced at intervals h as shown in FIG. 8, the slope of the curve at the point $y_0$ may be given by the high-order approximate formula $$y'_0 = \frac{1}{12h}(y_{-2} - 8y_{-1} + 8y_1 - y_2) \quad (23)$$

The method of evaluating the characteristic of the insulated gate transistor according to the first preferred embodiment enables the evaluation with higher accuracy than the conventional methods. Accordingly, the increase in the accuracy by the use of $R_{totSh}'/R_{totLo}'$ is reflected in the evaluation result more sufficiently than that of the background art.

Figure 9:
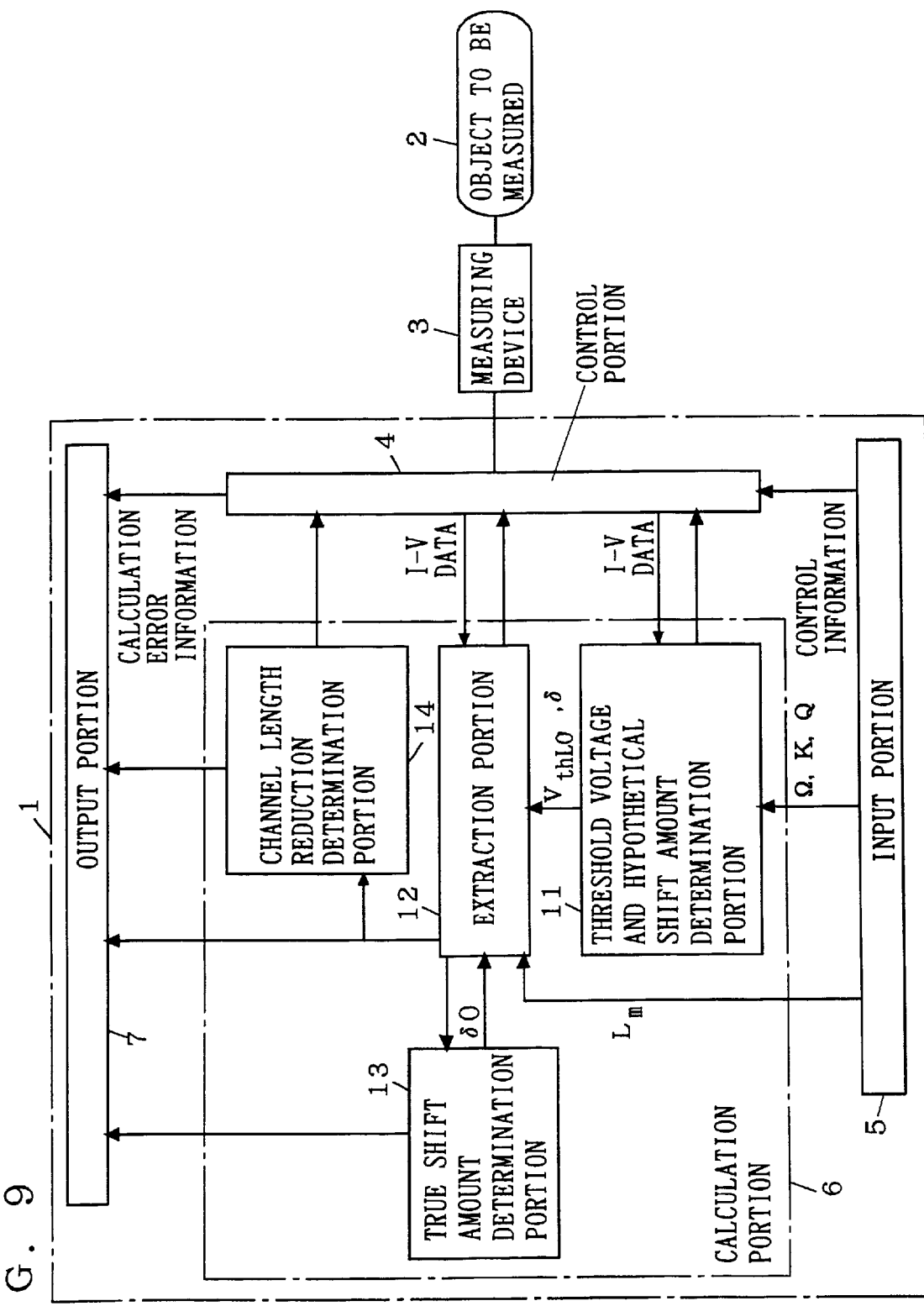
FIG. 9 is a block diagram showing an arrangement of a device for evaluating a characteristic of an insulated gate transistor according to the first preferred embodiment.

A device for evaluating a characteristic of an insulated gate transistor according to the first preferred embodiment will now be described with reference to FIG. 9. The insulated gate transistor characteristic evaluation device 1 is connected to a measuring device 3 for measuring an object 2 to be measured. An example of the object 2 to be measured includes an integrated circuit with the long and short transistors Lo and Sh incorporated therein. For instance, an integrated circuit drawn from a lot which has been subjected to the fabrication steps is set into the measuring device 3 and then measured therein. The measuring device 3 is controlled by a control portion 4 in the characteristic evaluation device 1. An input portion 5 provides control information to the control portion 4, and comprises a keyboard, a mouse, and the like. Measurement data from the measuring device 3 and the control information are inputted from the control portion 4 to a calculation portion 6. The calculation portion 6 extracts the effective channel length $L_{eff}$ and the series resistance $R_{sd}$, based on the data inputted from the input portion 5. An output portion 7 outputs the extracted effective channel length $L_{eff}$, the extracted series resistance $R_{sd}$, and the control information used during the extraction. The control information outputted from the output portion 7 is provided from the control portion 4 and the calculation portion 5.

The calculation portion comprises a threshold voltage and hypothetical shift amount determination portion 11 for determining the threshold voltages $V_{thLo}$ and $V_{thSh}$ and hypothetical shift amounts $\delta$; an extraction portion 12 for extracting the coordinates (DL*, $R_{sd}$*) of points of intersection which are the coordinates of the hypothetical points, and the slopes f of a characteristic curve at the points of intersection; a true shift amount determination portion 13 for determining the true shift amount $\delta 0$; and a channel length reduction determination portion 14 for determining the channel length reduction DL, the effective channel length $L_{eff}$, and the series resistance $R_{sd}$. The coordinates of the points of intersection are used herein as the coordinates of the hypothetical points at which changes in the total drain-to-source resistance $R_{tot}$ are estimated to be approximately zero if the gate overdrive $V_{gt}$ is slightly changed based on the $L_m$-$R_{tot}$ characteristic curve. However, the coordinates of the points of intersection may be determined by other than the method of determining the points of intersection. Otherwise, the coordinates of other points may be used as the coordinates of the hypothetical points as above described. The input portion 5 inputs to the threshold voltage and hypothetical shift amount determination portion 11 the value of the variable K for determining the upper limit $\delta_{sup}$ and the lower limit $\delta_{inf}$ of the range over which the hypothetical shift amount $\delta$ is changed, the range of the region $\Omega$ of the gate overdrive $V_{gt}$ to be measured, and the amount of change Q in the hypothetical shift amount $\delta$. The control portion 4 provides the measurement data about the source-drain current $I_{ds}$ and the gate-source voltage $V_{gs}$ to the threshold voltage and hypothetical shift amount determination portion 11. Upon receipt of these data, the threshold voltage and hypothetical shift amount determination portion 11 provides to the extraction portion 12 the threshold voltage $V_{thLo}$ of the long transistor Lo and the hypothetical shift amount $\delta$ indicative of the difference between the threshold voltage $V_{thLo}$ of the long transistor Lo and the threshold voltage $V_{thSh}$ of the short transistor Sh. Using the mask channel length $L_m$ from the input portion 5 and the measurement data about the source-drain current $I_{ds}$ and the gate-source voltage $V_{gs}$ from the control portion 4, the extraction portion 12 extracts the rates of change $dDL^*/dV_{gt}$ and $dR_{sd}^*/dV_{gt}$ in the coordinates (DL*, $R_{sd}$*) of the point of intersection and the slope f of the characteristic curve in the region $\Omega$ for each shift amount $\delta$. Using the rate of change $dDL^*/dV_{gt}$ in the $L_m$ coordinate of the point of intersection, the rate of change $dR_{sd}^*/dV_{gt}$ in the $R_{tot}$ coordinate of the point of intersection, and the slope f of the characteristic curve which are extracted by the extraction portion 12, the true shift amount determination portion 13 determines the hypothetical shift amount $\delta 0$ which minimizes the standard deviation of the function F given by one of Expressions (16), and (20) to (22) in the region $\Omega$. After the true shift amount $\delta 0$ is determined, the extraction portion 12 outputs the true shift amount $\delta 0$, and the $L_m$ coordinate DL* of a point of intersection, the total drain-to-source resistance $R_{tot}$ and the slope f of the characteristic curve which are associated with the true shift amount $\delta 0$ to the channel length reduction determination portion 14. The channel length reduction determination portion 14 determines the channel length reduction DL, based on the $L_m$ coordinate value DL* of the hypothetical point at the stationary point, and then performs the calculations given by Expressions (2) and (7) to determine the effective channel length $L_{eff}$ and the series resistance $R_{sd}$. The output portion 7 outputs the channel length reduction DL, the effective channel length $L_{eff}$ and the series resistance $R_{sd}$ which are determined by the channel length reduction determination portion 14, the coordinates (DL*, $R_{tot}$) of the points of intersection and the slopes f of the characteristic curve at the points of intersection which are extracted by the extraction portion 12, and the true shift amount $\delta 0$ determined by the true shift amount determination portion 13.

The above described arrangement provides the insulated gate transistor characteristic evaluation device which extracts the effective channel length $L_{eff}$ and the series resistance $R_{sd}$ with increased accuracy.

Figure 3:
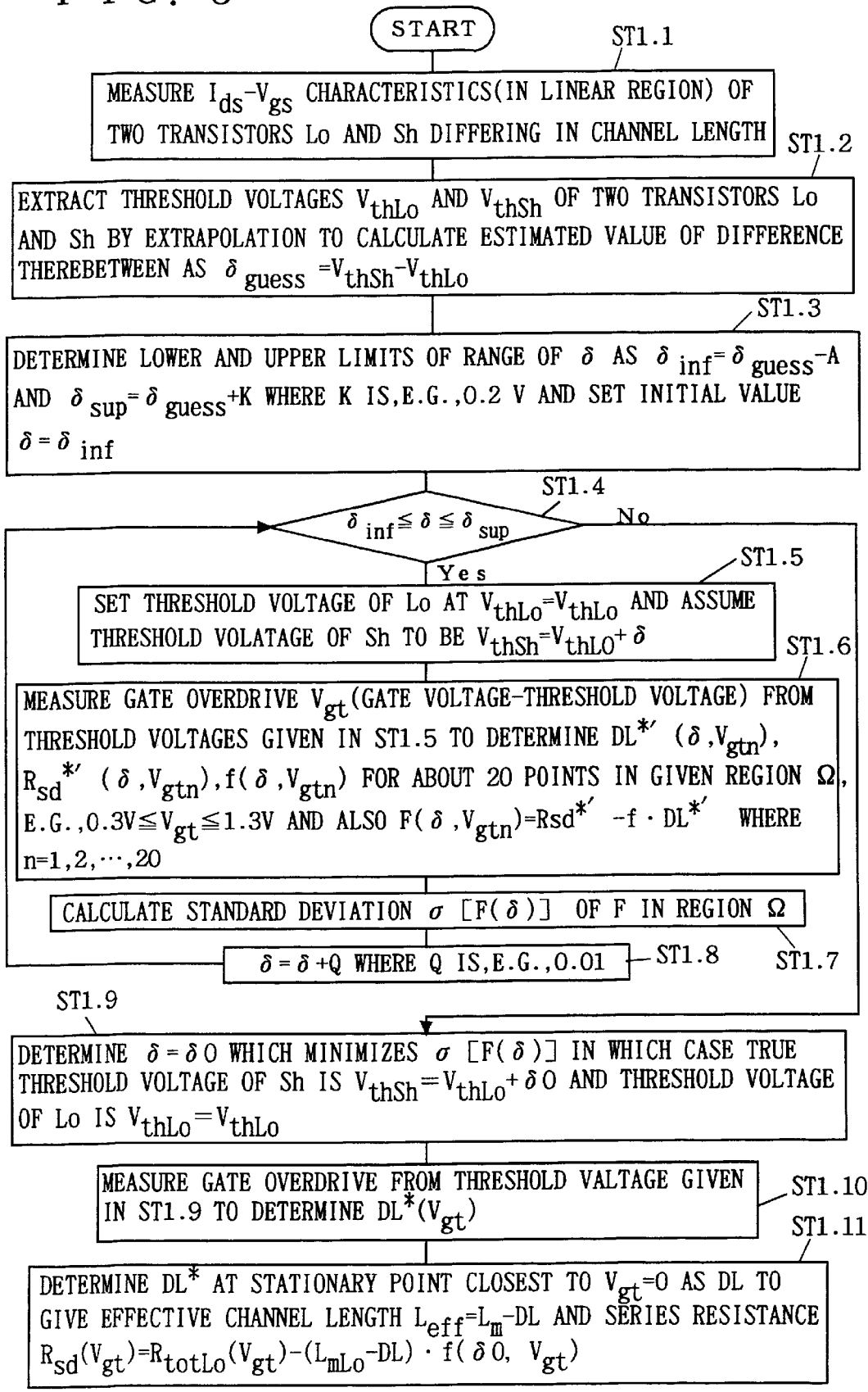
FIG. 3 is a flowchart showing a procedure of a method of evaluating a characteristic of an insulated gate transistor according to a first preferred embodiment of the present invention.
Figure 10:
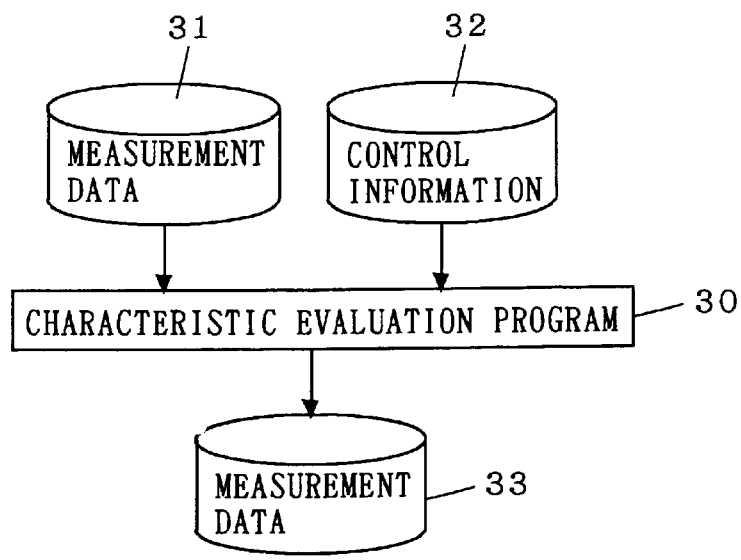
FIG. 10 conceptually shows a calculation portion shown in FIG. 9 as implemented using a computer.

It is needless to say that the insulated gate transistor characteristic evaluation described in the first preferred embodiment may be implemented using a computer in such a manner that the computer reads a characteristic evaluation program 30 for causing the computer to evaluate the insulated gate transistor according to the procedure shown in FIG. 3 which is described in the first preferred embodiment from a recording medium which stores the characteristic evaluation program 30 therein as shown in FIG. 10. The characteristic evaluation program 30 may be executed to extract measurement data 33 including the data pertaining to the effective channel length $L_{eff}$ and the series resistance $R_{sd}$, for example, based on measurement data 31 from the measuring device 3 of FIG. 9 and control information 32 from the input portion 5 as described in the first preferred embodiment.

A method of fabricating an insulated gate transistor according to the first preferred embodiment will be described hereinafter with reference to FIG. 11. First, the short transistor Sh serving as a target and the long transistor Lo serving as a reference are prototyped (step ST50). Then, the electrical characteristics of the short transistor Sh and the long transistor Lo are measured (step ST51). In this step of measurement are measured the $I_{ds}$-$V_{ds}$ characteristic, an off leak current $I_{off}$, and a drain current $I_{dmax}$ of each of the transistors. The off leak current $I_{off}$ is a source-drain current flowing when $V_{ds}$=VDD and $V_{gs}$=$V_{bs}$=0V, for example. The current $I_{dmax}$ is a source-drain current flowing when $V_{ds}$=$V_{gs}$=VDD and $V_{bs}$=0V. The reference character VDD designates a power supply voltage herein.

Next, the threshold voltage $V_{thSh}$ and the effective channel length $L_{effSh}$ of the short transistor Sh are extracted from the $I_{ds}$-$V_{ds}$ characteristic and the like by using the method of evaluating the characteristic of the insulated gate transistor described in the first preferred embodiment. Then, whether or not the threshold voltage $V_{thSh}$, the effective channel length $L_{effSh}$ and the currents $I_{dmax}$ and $I_{off}$ of the short transistor Sh satisfy specifications is judged (step ST53). If the specifications are not satisfied, the flow returns to the step ST50, and prototypes are again produced using a new mask.

Figure 13:
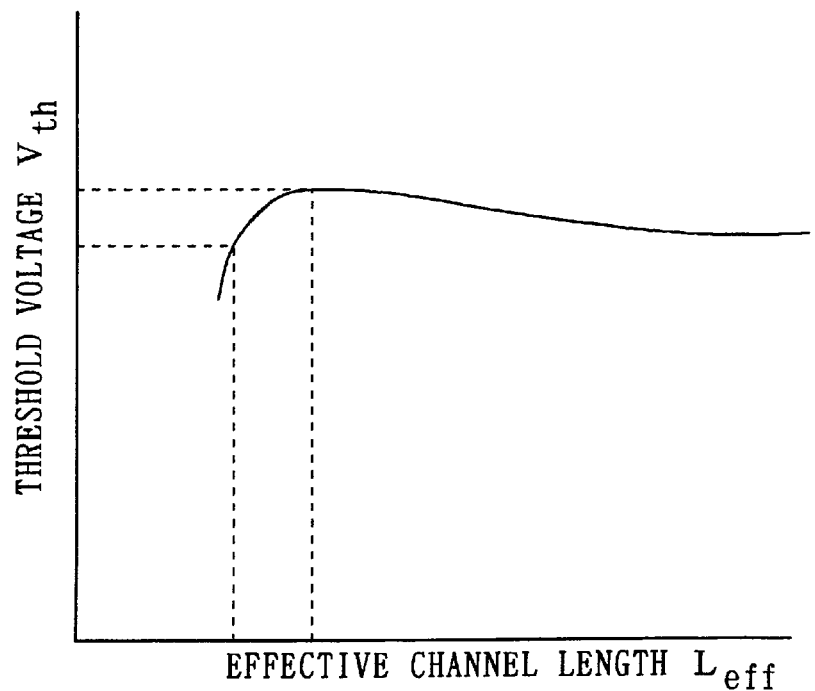
FIG. 13 is a graph showing the relationship between the effective channel length and a threshold voltage in the fabrication of the insulated gate transistor.

The method of evaluating the characteristic of the insulated gate transistor according to the first preferred embodiment may determine the threshold voltage based on the known mask channel length and the electrical characteristics with high accuracy, thereby to reduce the time required for fabrication as compared with the method which involves the observation of the cross-section of the insulated gate transistor. Additionally, the method of evaluating the characteristic of the insulated gate transistor according to the first preferred embodiment may accurately determine the range of the effective channel length $L_{eff}$ for the desired mask channel length $L_m$ in accordance with the gate overdrive $V_{gt}$. Further, the method of evaluating the characteristic of the insulated gate transistor according to the first preferred embodiment may accurately determine the range of changes in the threshold voltage $V_{th}$ in corresponding relation to the range of changes in the effective channel length $L_{eff}$ at the same time (See FIG. 13), thereby facilitating quality control for the threshold voltage $V_{th}$ in the fabrication steps.

Second Preferred Embodiment

Figure 14:
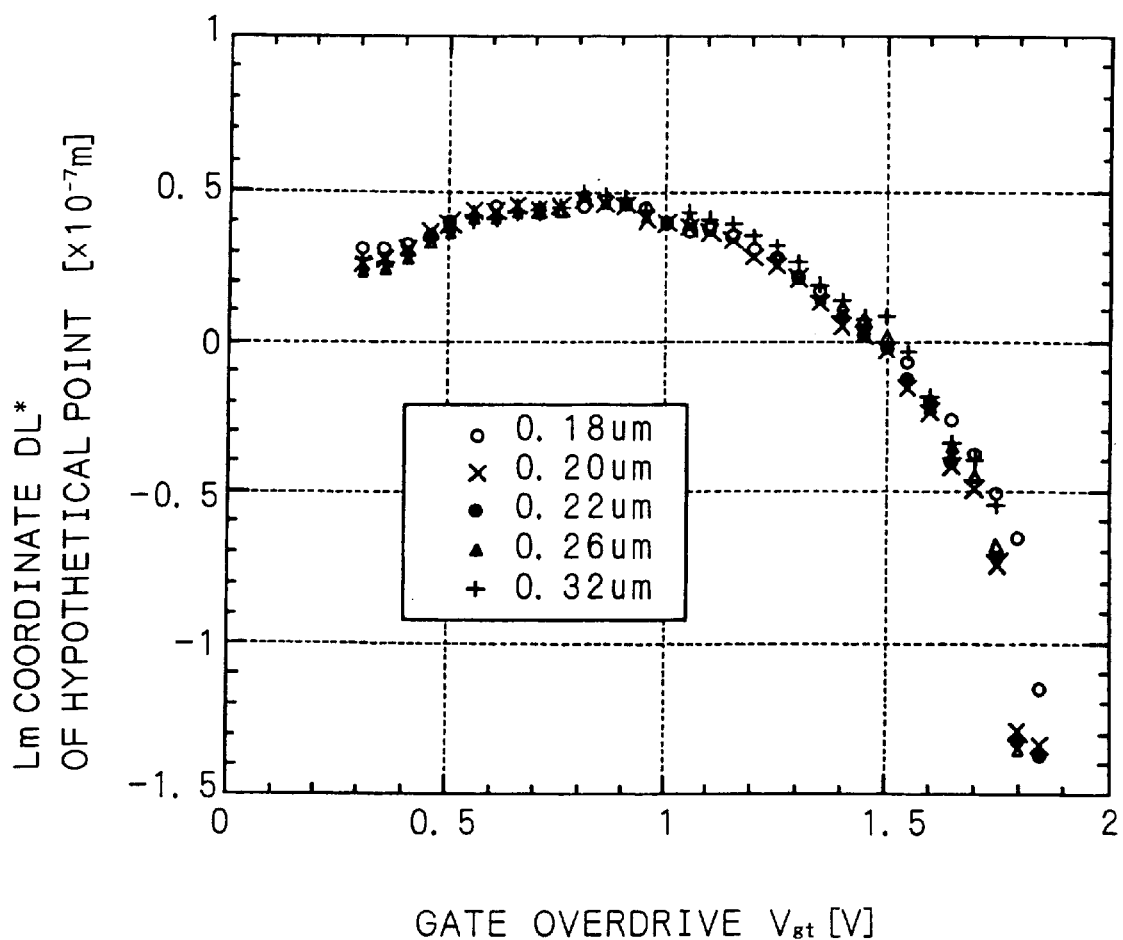
FIG. 14 is a graph for illustrating the outline of a second preferred embodiment of the present invention.

The outline of the method of evaluating the characteristic of the insulated gate transistor according to a second preferred embodiment of the present invention will now be described with reference to FIG. 14. FIG. 14 is a graph showing changes in the $L_m$ coordinate value DL* versus the gate overdrive $V_{gt}$ determined by the method of evaluating the characteristic of the insulated gate transistor of the first preferred embodiment. The graph of FIG. 14 depicts the changes in the $L_m$ coordinate value DL* for five short transistors Sh having different mask channel length $L_{mSh}$ when the true threshold voltage is used. The mask channel length $L_{mLo}$ of the long transistor Lo serving as a reference for extraction of the $L_m$ coordinate value DL* is commonly 21.6 μm. It will be understood from the comparison between the graphs of FIGS. 14 and 16 that, when the true threshold voltage is used, the changes in the $L_m$ coordinate value DL* versus the gate overdrive $V_{gt}$ are substantially similar independently of the mask channel length $L_{mSh}$ of the short transistor Sh. Thus, if the value of the gate overdrive $V_{gt}$ which conforms to the characteristic curves of this graph, for example, in a range from 0.3 to 1.2 V is found, the true threshold voltage of the short transistors Sh may be extracted. It should be noted that the first and second insulated gate transistors, the first and second overdrives and the first and second estimated values of the second preferred embodiment are similar in definition to those of the first preferred embodiment.

An example of the method of evaluating the characteristic of the insulated gate transistor according to the second preferred embodiment of the present invention is described below with reference to FIGS. 15 and 16. In the method shown in FIG. 15, the characteristic curves shown in FIG. 14 are extracted by using the small standard deviation of the characteristic curves in the range from 0.3 to 1.2 V, for example. The method of evaluating the characteristic of the insulated gate transistor of the second preferred embodiment determines the true threshold voltage of the short transistor by utilizing the dependence of the $L_m$ coordinate value DL* upon the gate overdrive $V_{gt}$. Therefore, the second preferred embodiment is similar to the first preferred embodiment in the procedure of the determination of the true threshold voltage. The method of evaluating the characteristic of the insulated gate transistor of the second preferred embodiment differs from that of the first preferred embodiment in the step ST1 of the procedure shown in FIG. 1 but is similar thereto in the step ST2.

Figure 15:
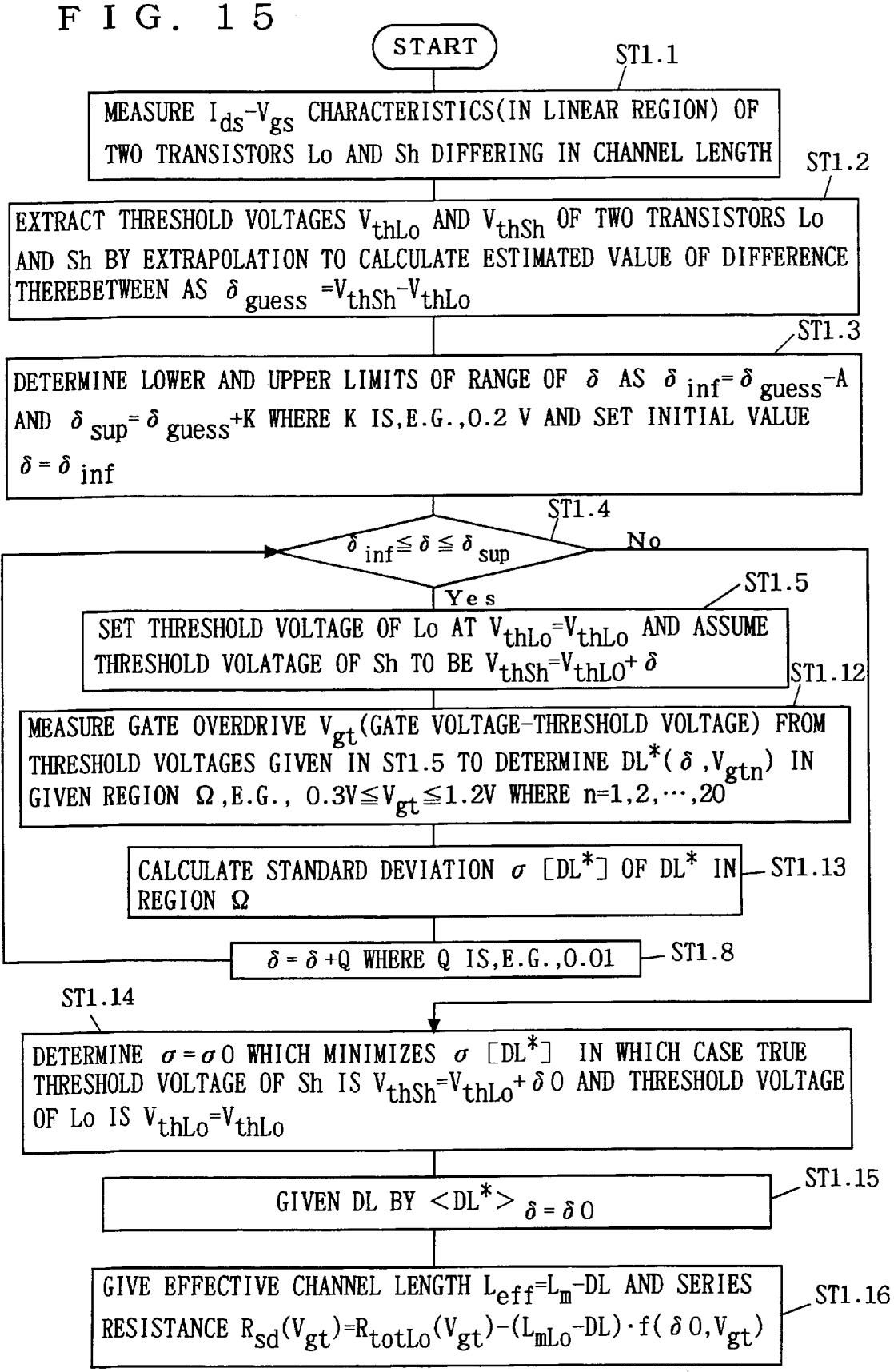
FIG. 15 is a flowchart showing a procedure of the method of evaluating the characteristic of the insulated gate transistor according to the second preferred embodiment.

FIG. 15 shows an example of the procedure of the extraction of the effective channel length $L_{eff}$ in the step ST1 according to the second preferred embodiment. The procedure of the extraction of the effective channel length $L_{eff}$ in the method of evaluating the characteristic of the insulated gate transistor of the second preferred embodiment differs from that of the first preferred embodiment in that the steps ST1.12, the step ST1.13 and the steps ST1.14 to ST1.16 of FIG. 15 are used in place of the steps ST1.6, the step ST1.7, and the steps ST1.9 to ST1.11 of FIG. 3, respectively.

The graph of FIG. 16 plots the extracted $L_m$ coordinate values DL* of hypothetical points determined in the step ST1.12 of FIG. 15 on the Y-axis versus the gate overdrive $V_{gt}$ on the X-axis. The $L_m$ coordinate value DL* of the hypothetical point and the gate overdrive $V_{gt}$ also outside the region Ω are plotted in FIG. 16 for ease of illustration of the relationship between the $L_m$ coordinate value DL* of the hypothetical point and the gate overdrive $V_{gt}$. In the step ST1.13, the average value of the $L_m$ coordinate value DL* of the hypothetical point and the standard deviation σ[DL*] are calculated for the shift amount δ.

If it is judged that the calculation in the step ST1.13 for the shift amount δ in the predetermined range from $δ_{inf}$ to $δ_{sup}$ has been completed, (step ST1.4), the shift amount δ0 which gives the true channel length reduction DL is estimated in the step ST1.14. The shift amount δ0 estimated herein is the shift amount δ0 which minimizes the standard deviation σ[DL*]. In the step ST1.15, the true channel length reduction DL is provided by the average value of the $L_m$ coordinate value DL* of the hypothetical point for the shift amount δ0. In the step ST1.16, the effective channel length $L_{eff}$ is determined by the difference between the mask channel length $L_m$ and the true channel length reduction DL, and the series resistance $R_{sd}$ is determined by Expression (7).

Figure 17:
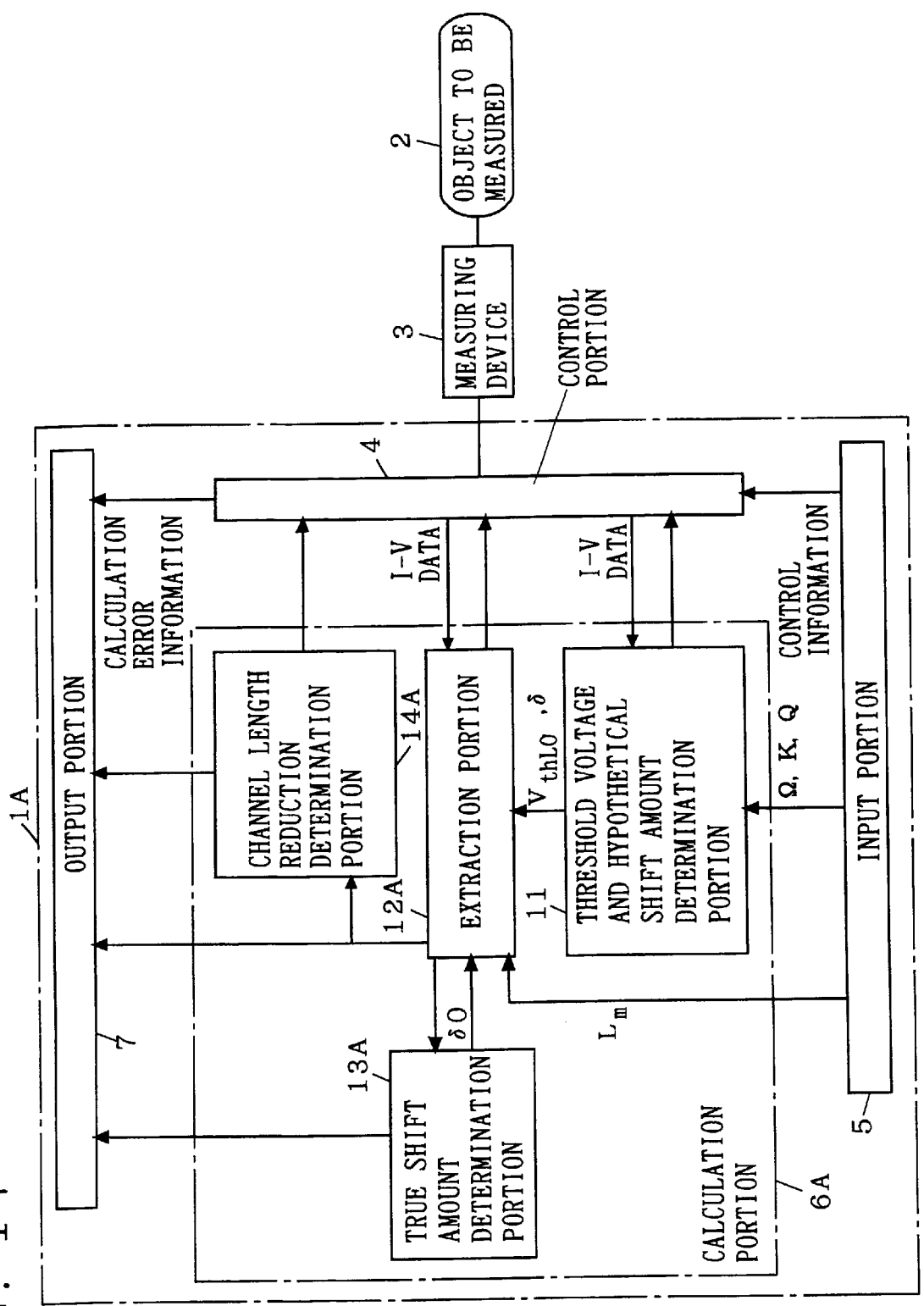
FIG. 17 is a block diagram showing an arrangement of the device for evaluating the characteristic of the insulated gate transistor according to the second preferred embodiment.

The device for evaluating the characteristic of the insulated gate transistor according to the second preferred embodiment will be described below with reference to FIG. 17. An insulated gate transistor characteristic evaluation device 1A, similar to the insulated gate transistor characteristic evaluation device 1 of the first preferred embodiment, is connected to the measuring device 3 for measuring the object 2 to be measured. The elements of the insulated gate transistor characteristic evaluation device 1A which are designated by the reference characters identical with those of the characteristic evaluation device 1 of FIG. 9 are elements corresponding to those of FIG. 9. More specifically, the characteristic evaluation device 1A is similar to the characteristic evaluation device 1 except an extraction portion 12A, a true shift amount determination portion 13A and a channel length reduction determination portion 14A which are included in a calculation portion 6A. The extraction portion 12A of the characteristic evaluation device 1A determines the coordinates (DL*, $R_{sd}$*) of points of intersection, with the gate overdrive $V_{gt}$ changed in the region Ω. The true shift amount determination portion 13A finds the hypothetical shift amount δ0 which minimizes the standard deviation σ[DL*] of the $L_m$ coordinate value DL* of a point of intersection in this region Ω to determine the true shift amount δ0. The extraction portion 12A outputs the true shift amount δ0 and its associated $L_m$ coordinate value DL* of the point of intersection to the channel length reduction determination portion 14A. The channel length reduction determination portion 14A determines the channel length reduction DL, based on the average of the $L_m$ coordinate value DL* of the hypothetical points extending over the region Ω for the true shift amount δ0.

Figure 11:
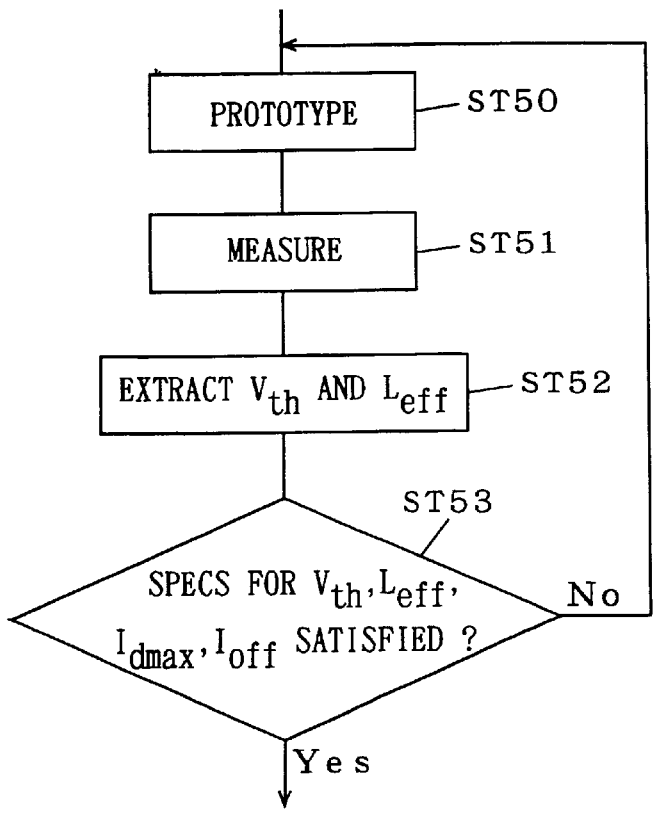
FIG. 11 is a flowchart showing the steps of fabrication of an insulated gate transistor using the method of evaluating the characteristic of the insulated gate transistor according to the first preferred embodiment.
Figure 12:
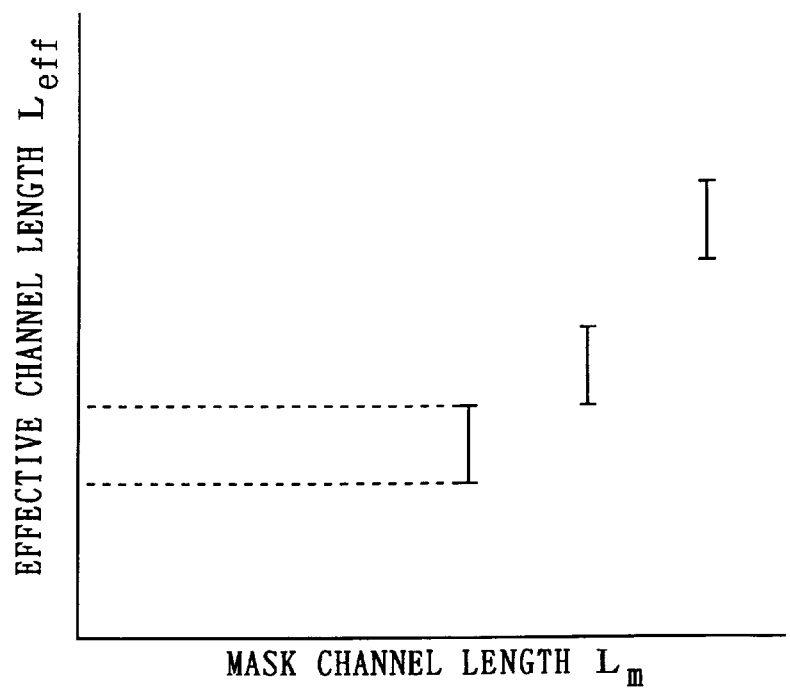
FIG. 12 is a graph showing the relationship between a mask channel length and an effective channel length in the fabrication of the insulated gate transistor.

The method of fabricating the insulated gate transistor according to the second preferred embodiment may be provided by replacing the KY method in the step ST52 of FIG. 11 with the method of evaluating the characteristic of the insulated gate transistor of the second preferred embodiment, thereby providing effects similar to those of the first preferred embodiment.

In the extraction of the channel length reduction DL according to the first and second preferred embodiments, the true channel length reduction DL of the short transistor Sh may be determined with little influence of the difference between the mask channel length $L_{mLo}$ and a gate finished length $L_{gLo}$ of the long transistor Lo exerted upon the determination of the $L_m$ coordinate value DL* of the hypothetical points, if the mask channel length $L_{mSh}$ of the short transistor Sh is sufficiently small relative to the mask channel length $L_{mLo}$ of the long transistor Lo ($L_{mSh} \ll L_{mLo}$). For instance, the evaluation of device/circuit performance with a pattern width of not greater than 0.35 μm requires the extraction of the channel length reduction DL of each transistor. For the extraction of the channel length reduction DL for each transistor, two transistors are used: one short transistor Sh and one long transistor Lo serving as a reference. In such extraction of the channel length reduction DL, an error occurs which results from the difference between a gate finished length $L_g$ and the mask channel length $L_m$ depending on transistors, which will be described below. The $L_m$ coordinate value DL* of the hypothetical point when the mask channel length $L_m$ is used is given by $$DL^*(V_{gt}) = \left( L_{mSh} - \frac{R'_{totSh}}{R'_{totLo}} \cdot L_{mLo} \right) \cdot \left( 1 - \frac{R'_{totSh}}{R'_{totLo}} \right)^{-1} \quad (24)$$

The $L_g$ coordinate of a point of intersection in a gate finished length versus total drain-to-source resistance plane ($L_g$–$R_{tot}$ plane) is designated by DL**.

$$DL^{**}(V_{gt}) = \left( L_{gSh} - \frac{R'_{totSh}}{R'_{totLo}} \cdot L_{gLo} \right) \cdot \left( 1 - \frac{R'_{totSh}}{R'_{totLo}} \right)^{-1} \quad (25)$$

The difference between the gate finished length $L_{gLo}$ and the mask channel length $L_{mLo}$ of the long transistor Lo is designated by $\Delta L_{Lo}$, and the difference between the gate finished length $L_{gSh}$ and the mask channel length $L_{mSh}$ of the short transistor Sh is designated by $\Delta L_{Sh}$. Then, the relationships expressed by $$L_{gLo} = L_{mLo} + \Delta L_{Lo} \quad (26)$$

$$L_{gSh} = L_{mSh} + \Delta L_{Sh} \quad (27)$$

hold. Using Expression (27) based on Expression (24), the difference between the $L_m$ coordinate value DL* of the point of intersection and the $L_g$ coordinate value DL** of the point of intersection is $$DL^* - DL^{**} = -\Delta L_{Sh} + \frac{R'_{totSh}}{R'_{totLo}} \cdot \left( 1 - \frac{R'_{totSh}}{R'_{totLo}} \right)^{-1} \cdot \Delta L \quad (28)$$

$$\approx -\Delta L_{Sh} + \frac{R'_{totSh}}{R'_{totLo}} \cdot \Delta L \quad \text{(for } L_{mSh} \ll L_{mLo}\text{)}$$

$$\approx -\Delta L_{Sh} + \frac{L_{effSh}}{L_{effLo}} \cdot \Delta L$$

where ΔL is defined as $$\Delta L \equiv \Delta L_{Lo} - \Delta L_{Sh} \quad (29)$$

Expressions (27) and (28) show that the effective channel length $L_{eff}$ of the short transistor Sh is extracted when the relationship $L_{mSh} \ll L_{mLo}$ holds. The second term of the last expression (rightmost side) of Expression (28) represents an error.

$$\frac{L_{effSh}}{L_{effLo}} \cdot |\Delta L| < r \cdot L_{effSh} \quad (30)$$

where r is a relative error. Assuming that $L_{Lo} \approx L_{mLo}$, Expression (30) is transformed into $$L_{mLo} > \frac{|\Delta L|}{r} \quad (31)$$

Expression (31) limits the size of the long transistor Lo. For example, when ΔL=0.1 μm and r=0.02, the mask channel length $L_{mLo}$ of the long transistor Lo is required to be greater than 5 μm for accurate extraction of the effective channel length $L_{effSh}$ of the short transistor Sh.

The influence of unequal channel widths due to field isolation variations will now be contemplated. The total drain-to-source resistance $R_{tot}$ is expressed by $$R_{totSh} = \frac{L_{effSh}}{W_{effSh}} \cdot g + R_{sd} \quad (32)$$

where g is a sheet resistance of a channel.

Using ΔW (=$W_{effSh}$–$W_{effLo}$) as the difference in channel width W between the short transistor Sh and the long transistor Lo, Expression (32) is transformed into $$R_{totSh} = \frac{L_{effSh}}{W_{effLo} + \Delta W} \cdot g + R_{sd} \quad (33)$$

$$\approx \frac{L_{effSh} \cdot \left( 1 - \frac{\Delta W}{W_{effLo}} \right)}{W_{effLo}} \cdot g + R_{sd}$$

Expression (33) shows that the effective channel length $L_{effSh}$ appears to be multiplied by (1–ΔW/$W_{effLo}$) if it is assumed that the sheet resistance g is not dependent upon the effective channel width $W_{eff}$. For an error Δr, $$L_{effSh} \cdot \frac{|\Delta W|}{W_{effLo}} < r \cdot L_{effSh} \quad (34)$$

is given where r is the relative error.

Assuming that the effective channel width $W_{effLo}$ is approximately equal to the mask channel width $W_{mLo}$, Expression (34) is transformed into $$W_{mLo} > \frac{|\Delta W|}{r} \quad (35)$$

Expression (35) limits the mask channel width $W_{mLo}$ of the long transistor Lo used for the extraction. For example, when the effective channel width difference $\Delta W$ between the two transistors Lo and Sh is 0.1 µm and the relative error r is 0.02, the mask channel length $L_{mLo}$ of the long transistor Lo is required to be greater than 5 µm for accurate extraction of the effective channel length $L_{effSh}$ of the short transistor Sh.

The influence of the difference in series resistance $R_{sd}$ between transistors used for the extraction will be contemplated. Assuming that the dependence of the series resistance $R_{sd}$ upon the gate overdrive $V_{gt}$ is negligible, an error $\Delta R_{sdSh}$ is expressed by $$\Delta R_{sdSh} \equiv R_{sd}* - R_{sd}** \approx \frac{L_{effSh}}{L_{effLo} - L_{effSh}} \quad (36)$$

$$\approx \frac{L_{effSh}}{L_{effSh}} \cdot \Delta R_{sd} \le \frac{L_{mSh}}{L_{mLo}} \cdot \Delta R_{sd}$$

where $\Delta R_{sd}$ is given by $$\Delta R_{sd} = R_{sdSh} - R_{sdLo} \quad (37)$$

Figure 34:
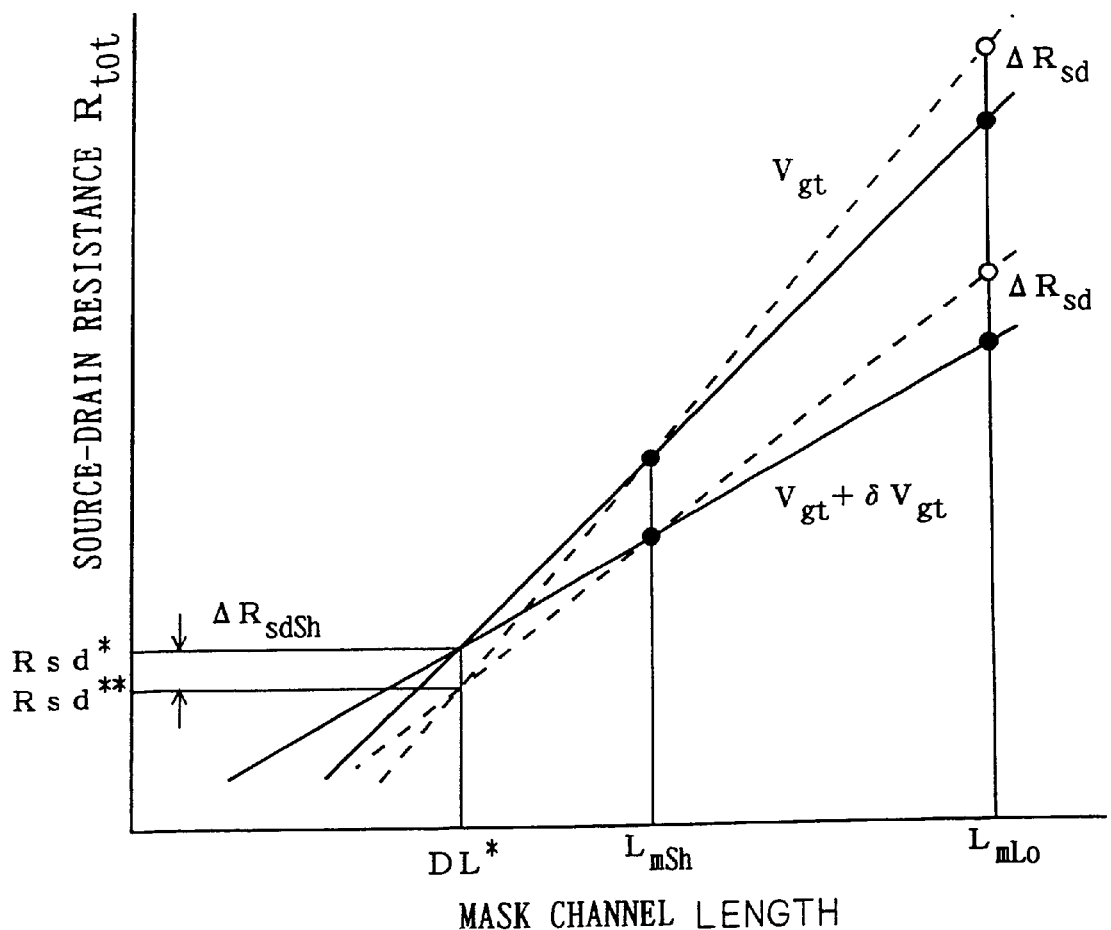
FIG. 34 illustrates the definition of $R_{sd}^*$ and $R_{sd}^{**}$.

$R_{sd}* - R_{sd}**$ is defined in FIG. 34.

Using the relative error r, $$\frac{L_{mSh}}{L_{mLo}} \cdot |\Delta R_{sd}| < r \cdot R_{sdSh} \quad (38)$$

is given. Expression (38) is transformed into $$L_{mLo} > \frac{1}{r} \cdot \frac{|\Delta R_{sd}|}{R_{sdSh}} \cdot L_{mSh} \quad (39)$$

Expression (39) limits the size of the long transistor Lo. For example, when $|\Delta R_{sd}|/R_{sdSh}=1$, r=0.05 and $L_{mSh}=0.2$ µm, the mask channel length $L_{mLo}$ of the long transistor Lo is required to be greater than 4 µm for accurate extraction of the effective channel length $L_{effSh}$ of the short transistor Sh.

The influence of a saturation drift velocity upon the extraction of the channel length reduction DL will be contemplated. The drain current may be estimated as $$I_{ds} = \frac{\mu \cdot C_{OX} \cdot W_{eff}}{L_{eff}} \cdot \left(1 + \frac{U1 \cdot V_{ds}}{L_{eff}}\right)^{-1} \cdot \left(V_g - V_{th} - \frac{V_{ds}}{2}\right) \quad (40)$$

where µ is a mobility, $C_{ox}$ is an oxide capacitance, and $U1=\mu/(2 \cdot V_{sat})$ where $V_{sat}$ is a saturation velocity. The term $(1+U1 \cdot V_{ds}/L_{eff})^{-1}$ expresses the effect of the saturation drift velocity. Assuming that the channel resistance per unit channel is not dependent upon the effective channel length $L_{eff}$, the effective channel length $L_{effSh}$ of the short transistor Sh effectively appears to be multiplied by $(1+U1 \cdot V_{ds}/L_{eff})$. As a result, the extracted channel length reduction DL is smaller by $U1 \cdot V_{ds}$.

Figure 18:
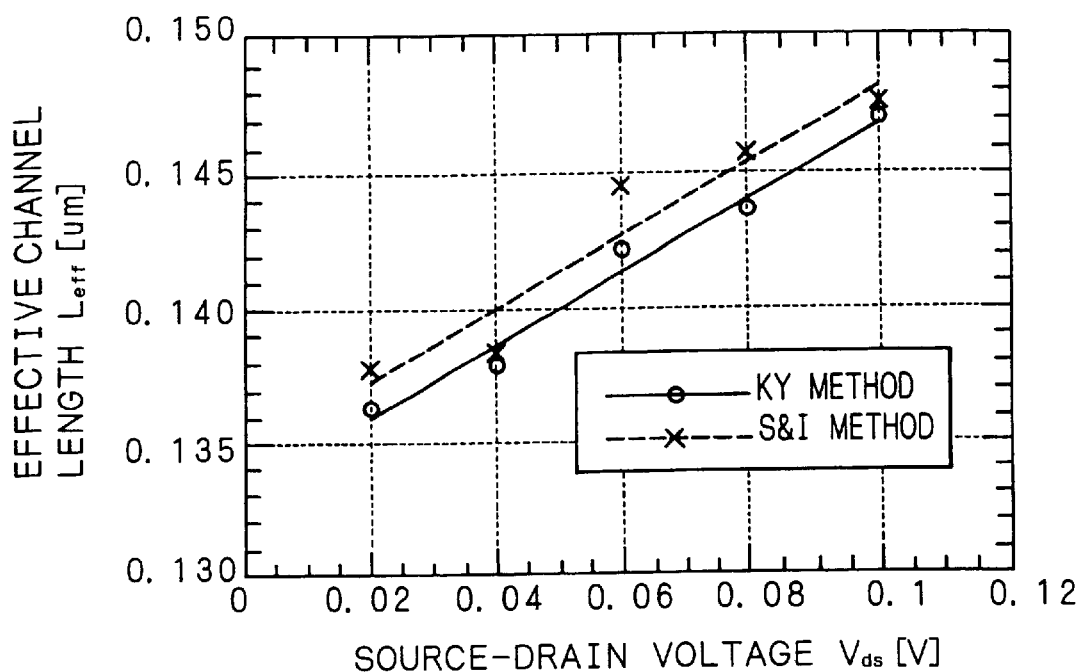
FIG. 18 is a graph showing a relationship between a gate-drain voltage and the effective channel length.
Figure 19:
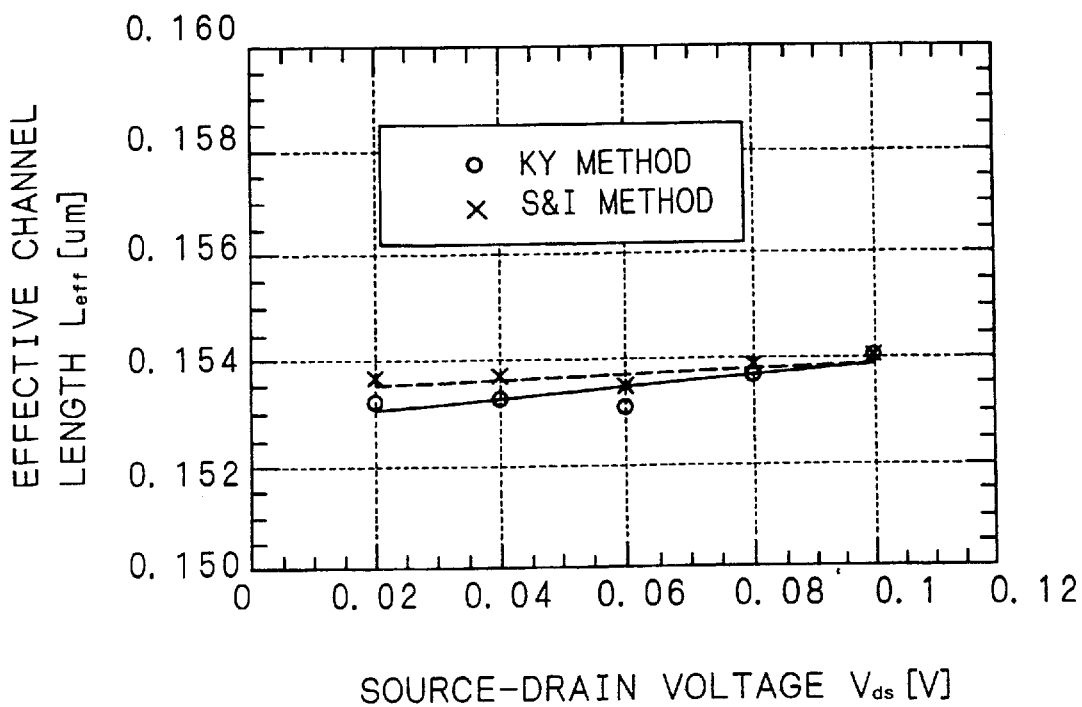
FIG. 19 is a graph showing another relationship between the gate-drain voltage and the effective channel length.

The saturation drift velocity limits the source-drain voltage $V_{ds}$ among the measurement bias conditions of the source-drain current versus source-drain voltage characteristic ($I_{ds}$-$V_{ds}$ characteristic). FIGS. 18 and 19 show the dependence ($V_{ds}$-dependence) of the extracted values of the channel length reduction DL upon the source-drain voltage $V_{ds}$ for 0.18 µm NMOS and PMOS transistors, respectively. The S&I method shown in FIGS. 18 and 19 is the method of evaluating the characteristic of the insulated gate transistor of the second preferred embodiment. For the PMOS transistor, U1 indicative of the slope of the characteristic line drawn in the graph is not greater than about 0.03 µm/V. Thus, when the source-drain voltage $V_{ds}$ is not greater than 0.1 V, the extracted values of the channel length reduction DL have a difference of only not greater than about 0.003. For the NMOS transistor, on the other hand, the slope U1 is about 0.15 µm/V. Thus, when the source-drain voltage $V_{ds}$ is 0.1 V, the extracted value of the channel length reduction is about 0.015 µm smaller. The value of the true effective channel length $L_{eff}$ is provided by the effective channel length $L_{eff}$ at the source-drain voltage $V_{ds}=0$ by the extrapolation from the line indicative of the effective channel length versus source-drain voltage characteristic, for example, by using the value of the effective channel length for each drain voltage inputted from the calculation portion δ shown in FIG. 9 to the output portion 7. However, the extracted value from data which indicates that the source-drain voltage $V_{ds}$ is 0.05 V is used for monitoring the effective channel length $L_{eff}$ in the fabrication steps. When the extrapolated value is used, the monitoring must be performed in consideration for the requirement of data which are at least twice greater and the variations which might be greater than actual variations.

The efficient and accurate extraction of a channel length reduction DLT defined by the difference between the gate finished length $L_g$ and the effective channel length $L_{eff}$ is important for correction of the gate finished length $L_g$ in parameter extraction associated with logic circuit simulation, for example, SPICE parameter extraction. For instance, in the SPICE parameter extraction, an electrical correction is made to the gate finished length $L_g$ of transistors having a mask channel length $L_m$ of not greater than about 0.5 µm. The non-linear relationship between the mask channel length $L_m$ and the gate finished length $L_g$ is not permitted to be neglected for transistors having a mask channel length $L_m$ of not greater than 0.35 µm. Therefore, it is necessary to know the gate finished length $L_g$ of each of the transistors. However, it is difficult to measure the gate finished length $L_g$ of all transistors under an electron microscope. Then, the KY method of the first preferred embodiment or the S&I method of the second preferred embodiment may be used to make the electrical correction to the gate finished length $L_g$ in a manner to be described below.

Figure 20:
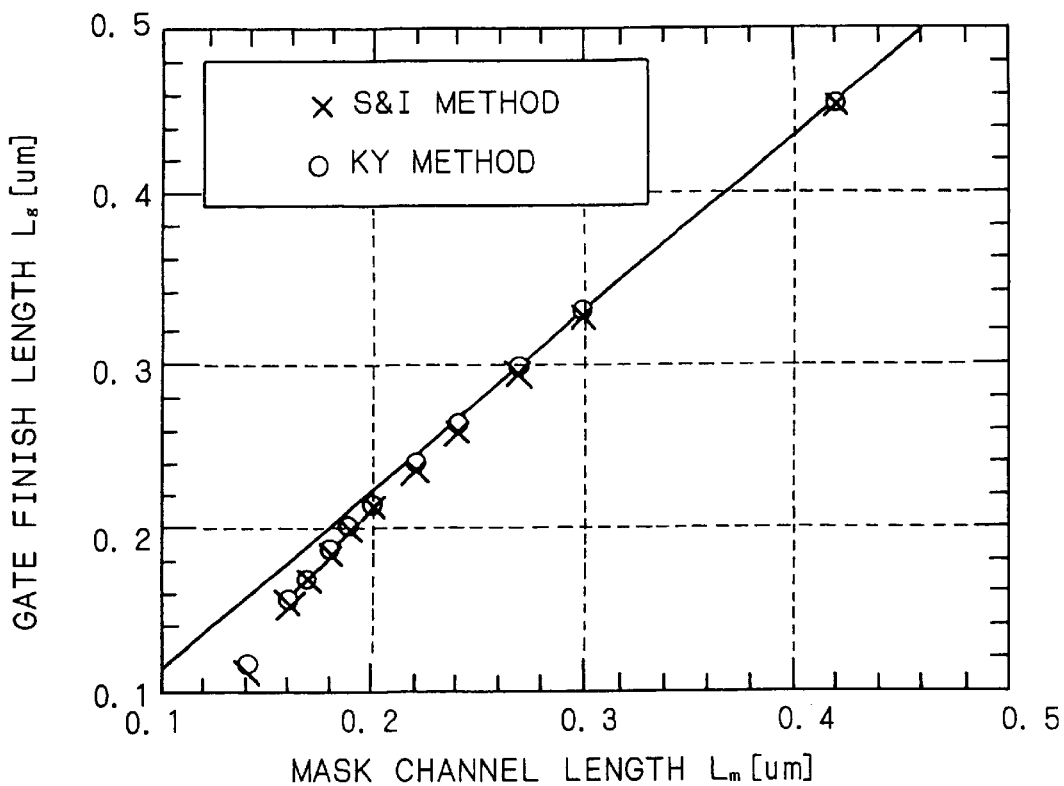
FIG. 20 is a graph showing the correction of a gate finished length by KY and S&I methods.
Figure 21:
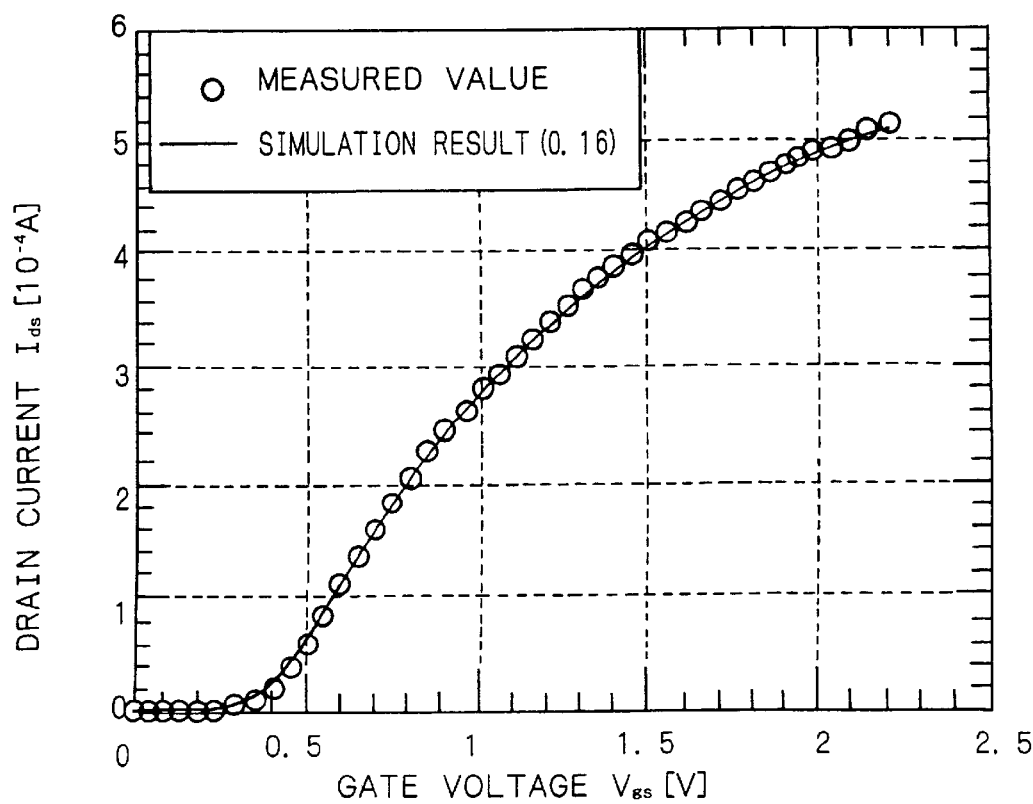
FIG. 21 is a graph for comparison between measured values and a first simulation result of a drain current versus gate voltage characteristic.
Figure 22:
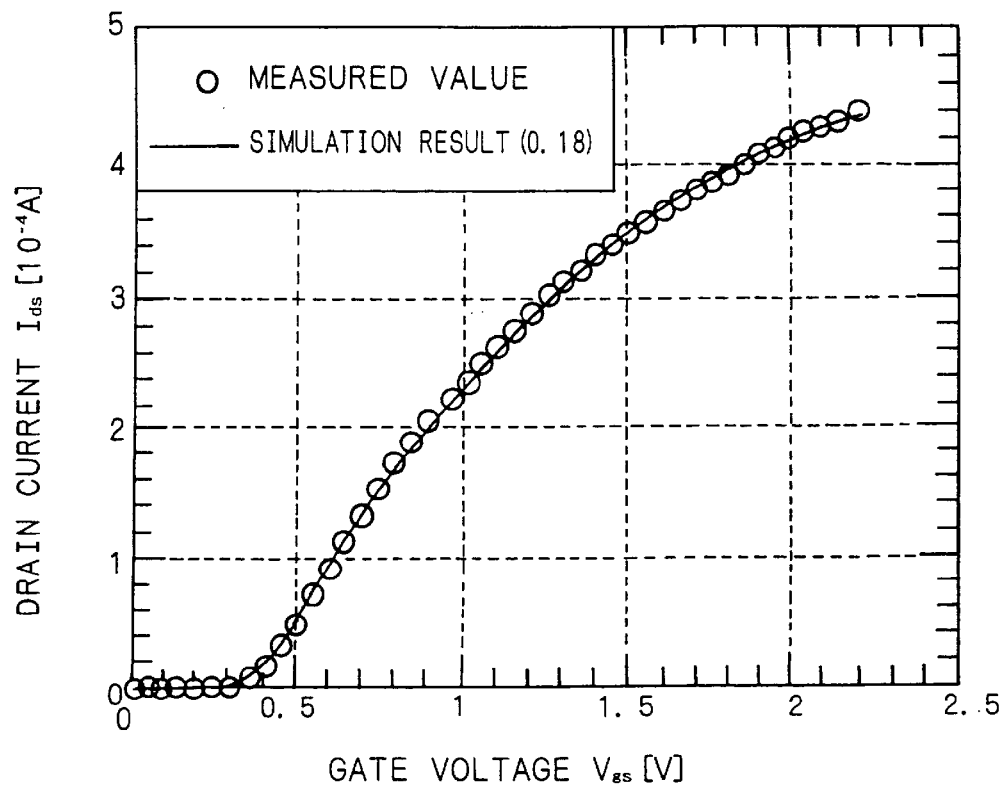
FIG. 22 is a graph for comparison between the measured values and a second simulation result of the drain current versus gate voltage characteristic.
Figure 23:
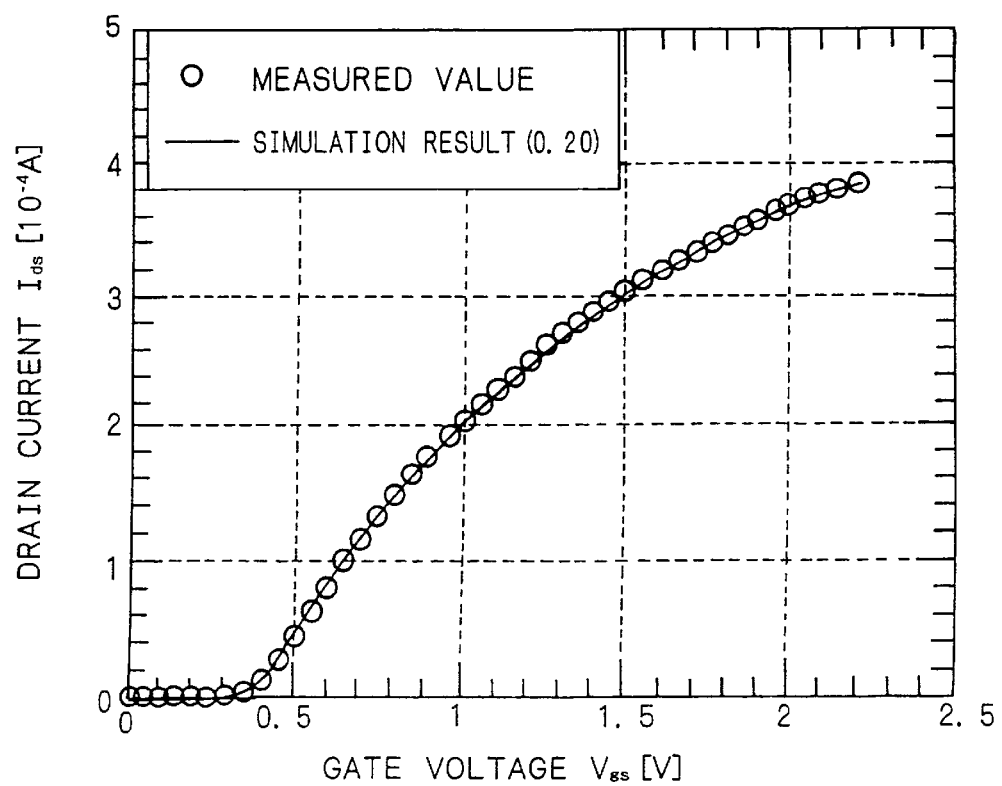
FIG. 23 is a graph for comparison between the measured values and a third simulation result of the drain current versus gate voltage characteristic.
Figure 24:
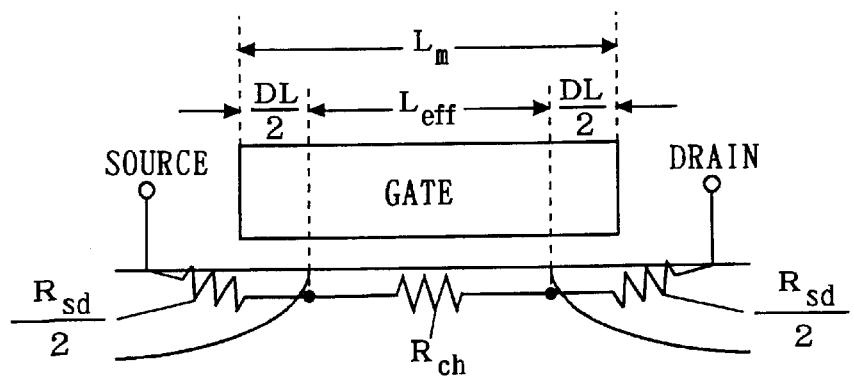
FIG. 24 conceptually shows the relationship between a channel resistance, a series resistance, the effective channel length, the mask channel length, and the channel length reduction.

First, the gate finished length $L_g$ of at least one transistor is measured under an electron microscope by using a conventional technique. The measured transistor serves as a reference. Next, the difference DLT between the gate finished length $L_g$ and the effective channel length $L_{eff}$ of the at least one transistor serving as the reference is extracted by the KY method or the S&I method. Then, the effective channel length $L_{eff}$ of a transistor with the gate finished length $L_g$ having not yet been measured under the electron microscope is extracted, and the gate finished length $L_g$ of the transistor is given by the sum of the effective channel length $L_{eff}$ and the channel length reduction DLT. An interpolated value of the channel length reduction DLT is used if two or more transistors which differ in mask channel length $L_m$ are used as a reference. It is assumed herein that the variations in the channel length reduction DLT are negligible relative to the variations in the gate finished length $L_g$. FIG. 20 shows the result of the correction of the gate finished length $L_g$ of a PMOS transistor having a mask channel length $L_m$ of 0.18 μm by using the KY method and the S&I method. FIGS. 21 to 23 show the $I_{ds}$-$V_{ds}$ characteristic for measured values and simulation results using the values extracted by the KY method when the mask channel width $W_m$ is 21.6 μm and the mask channel length $L_m$ is 0.16 μm, 0.18 μm and 0.20 μm, respectively. The measured values and the simulation results shown in FIGS. 21 to 23 coincide with each other with such accuracy that an error is not greater than 2%.

While the invention has been described in detail, the foregoing description is in all aspects illustrative and not restrictive. It is understood that numerous other modifications and variations can be devised without departing from the scope of the invention.

We claim:

1. An insulated gate transistor characteristic evaluation device using at least two insulated gate transistors differing from each other only in mask channel length and including a first insulated gate transistor having a longer channel length and a second insulated gate transistor having a shorter channel length, said insulated gate transistor characteristic evaluation device for evaluating a characteristic of said second insulated gate transistor using a characteristic of said first insulated gate transistor as a reference, said insulated gate transistor characteristic evaluation device comprising:

threshold voltage estimation means for extracting a threshold voltage for said first insulated gate transistor to estimate a threshold voltage for said second insulated gate transistor to define the estimated value as a first estimated value;

extraction means for extracting a hypothetical point at which a change in a total drain-to-source resistance is estimated to be approximately zero when first and second gate overdrives are slightly changed, based on a characteristic curve drawn in an X-Y plane with said mask channel length measured on an X-axis and said total drain-to-source resistance measured on a Y-axis, said characteristic curve indicating the relationship between said mask channel length of said first and second insulated gate transistors and said total drain-to-source resistance, the value of said mask channel length and the value of said total drain-to-source resistance at said hypothetical point being defined as second and third estimated values, respectively, said extraction means also extracting the slope of said characteristic curve at said hypothetical points to define the value of the slope as a fourth estimated value, said first gate overdrive being defined as the difference between the gate voltage of said first insulated gate transistor and the extracted threshold voltage of said first insulated gate transistor, said second gate overdrive being defined as the difference between the gate voltage of said first and second insulated gate transistors and said first estimated value;

threshold voltage determination means for determining optimum second to fourth estimated values that are respective ones of said second to fourth estimated values which satisfy that the amount of change in said third estimated value equals the product of the amount of change in said second estimated value and said fourth estimated value when said first and second gate overdrives are slightly changed, to determine an optimum first estimated value associated with said optimum second to fourth estimated values, thereby to determine a true threshold voltage of said second insulated gate transistor based on said optimum first estimated value; and channel length reduction determination means for determining the difference between said mask channel length and an effective channel length, and a series resistance, based on said true threshold voltage.

2. The insulated gate transistor characteristic evaluation device according to claim 1, wherein said extraction means approximates said characteristic curve using a first line drawn in said X-Y plane and passing through first and second points, said first point being given for said first insulated gate transistor when said first gate overdrive has a first value, said second point being given for said second insulated gate transistor when said second gate overdrive has said first value.

3. The insulated gate transistor characteristic evaluation device according to claim 2, wherein said threshold voltage determination means determines said optimum second to fourth estimated values which satisfy that the amount of change in said third estimated value equals the product of the amount of change in said second estimated value and said fourth estimated value when said first and second gate overdrives are slightly changed, using the relationship expressed by $$F(\delta, V_{gtLo}) = dL^*(\delta, V_{gtLo}) + \frac{f(\delta, V_{gtLo})}{f'(\delta, V_{gtLo})} \cdot dL^{*\prime}(\delta, V_{gtLo}) - DL^*(\delta, V_{gtLo})$$

where δ is the difference between the first estimated value of the threshold voltage of said second insulated gate transistor and the threshold voltage of said first insulated gate transistor, $V_{gtLo}$ is said first gate overdrive, dL* is an X-intercept provided by extrapolation from said characteristic curve, f is said slope of said characteristic curve at said hypothetical point, DL* is the X coordinate of said hypothetical point, and the prime denotes a first derivative with respect to $V_{gtLo}$.

4. The insulated gate transistor characteristic evaluation device according to claim 2, wherein said threshold voltage determination means determines said optimum second to fourth estimated values which satisfy that the amount of change in said third estimated value equals the product of the amount of change in said second estimated value and said fourth estimated value when said first and second gate overdrives are slightly changed, using the relationship expressed by $$F(\delta, V_{gtLo}) = \frac{f^2(\delta, V_{gtLo})}{f'(\delta, V_{gtLo})} \cdot dL^{*\prime}(\delta, V_{gtLo}) - R^*_{sd}(\delta, V_{gtLo})$$

where δ is the difference between the first estimated value of the threshold voltage of said second insulated gate transistor and the threshold voltage of said first insulated gate transistor, $V_{gtLo}$ is said first gate overdrive, dL* is an X-intercept provided by extrapolation from said characteristic curve, f is said slope of said characteristic curve at said hypothetical point, $R_{sd}^*$ is the Y coordinate of said hypothetical point, and the prime denotes a first derivative with respect to $V_{gtLo}$.

5. The insulated gate transistor characteristic evaluation device according to claim 2, wherein said threshold voltage determination means determines said optimum second to fourth estimated values which satisfy that the amount of change in said third estimated value equals the product of the amount of change in said second estimated value and said fourth estimated value when said first and second gate overdrives are slightly changed, using the relationship expressed by $$F(\delta, V_{gtLo}) = R^*(\delta, V_{gtLo}) - \frac{f(\delta, V_{gtLo})}{f'(\delta, V_{gtLo})} \cdot R^{*\prime}(\delta, V_{gtLo}) - R^*_{sd}(\delta, V_{gtLo})$$

where $\delta$ is the difference between the first estimated value of the threshold voltage of said second insulated gate transistor and the threshold voltage of said first insulated gate transistor, $V_{gtLo}$ is said first gate overdrive, $R^*$ is a Y-intercept provided by extrapolation from said characteristic curve, f is said slope of said characteristic curve at said hypothetical point, $R_{sd}^*$ is the Y coordinate of said hypothetical point, and the prime denotes a first derivative with respect to $V_{gtLo}$.

6. The insulated gate transistor characteristic evaluation device according to claim 2, wherein said threshold voltage determination means determines said optimum second to fourth estimated values which satisfy that the amount of change in said third estimated value equals the product of the amount of change in said second estimated value and said fourth estimated value when said first and second gate overdrives are slightly changed, using the relationship expressed by $$F(\delta, V_{gtLo}) = \frac{R^{*\prime}(\delta, V_{gtLo})}{f'(\delta, V_{gtLo})} + DL^*(\delta, V_{gtLo})$$

where $\delta$ is the difference between the first estimated value of the threshold voltage of said second insulated gate transistor and the threshold voltage of said first insulated gate transistor, $V_{gtLo}$ is said first gate overdrive, $R^*$ is a Y-intercept provided by extrapolation from said characteristic curve, f is said slope of said characteristic curve at said hypothetical point, $DL^*$ is the X coordinate of said hypothetical point, and the prime denotes a first derivative with respect to $V_{gtLo}$.

7. An insulated gate transistor characteristic evaluation device using, at least two insulated gate transistors differing from each other only in mask channel length and including a first insulated gate transistor having a longer channel length and a second insulated gate transistor having a shorter channel length, said insulated gate transistor characteristic evaluation device for evaluating a characteristic of said second insulated gate transistor using a characteristic of said first insulated gate transistor as a reference, said insulated gate transistor characteristic evaluation device comprising:

threshold voltage estimation means for extracting a threshold voltage for said first insulated gate transistor to estimate a threshold voltage for said second insulated gate transistor to define the estimated value as a first estimated value;

extraction means for extracting a hypothetical point at which a change in a total drain-to-source resistance is estimated to be approximately zero when a first gate overdrive and a second gate overdrive are slightly changed, based on a characteristic curve drawn in an X-Y plane with said mask channel length measured on an X-axis and said total drain-to-source resistance measured on a Y-axis, said characteristic curve indicating the relationship between said mask channel length of said first and second insulated gate transistors and said total drain-to-source resistance, the values of said mask channel length at said hypothetical point being defined as a second estimated value, said first gate overdrive being defined as the difference between the gate voltage of said first insulated gate transistor and the extracted threshold voltage of said first insulated gate transistor, said second gate overdrive being defined as the difference between the gate voltage of said second insulated gate transistor and said first estimated value;

threshold voltage determination means for determining a first estimated value by said second estimated value, said first estimated value satisfying that a characteristic curve indicating the relationship between said second gate overdrive measured on an X-axis and said second estimated values measured on a Y-axis has a predetermined configuration in a predetermined range of said second gate overdrive, to determine the determined first estimated value as a true threshold voltage of said second insulated gate transistor; and channel length reduction determination means for determining the difference between said mask channel length and an effective channel length, and a series resistance, based on said true threshold voltage.

8. The insulated gate transistor characteristic evaluation device according to claim 7, wherein said threshold voltage determination means determines a standard deviation of said second estimated value in said predetermined range to detect the characteristic curve having said predetermined configuration.

9. An insulated gate transistor characteristic evaluation device using at least two insulated gate transistors differing from each other only in mask channel length and including a first insulated gate transistor having a longer channel length and a second insulated gate transistor having a shorter channel length, said insulated gate transistor characteristic evaluation device for evaluating a characteristic of said second insulated gate transistor using a characteristic of said first insulated gate transistor as a reference, said insulated gate transistor characteristic evaluation device comprising:

calculation means for extracting an effective channel length from each of at least two drain current versus gate voltage characteristics differing from each other in source-drain voltage, and for extracting a series resistance from the at least two drain current versus gate voltage characteristics for values of the source-drain voltage; and output means for determining an effective channel length by extrapolation from the effective channel lengths extracted for different source-drain voltages.

10. A computer readable recording medium storing therein a characteristic evaluation program and using at least two insulated gate transistors differing from each other only in mask channel length and including a first insulated gate transistor having a longer channel length and a second insulated gate transistor having a shorter channel length, said computer readable recording medium for causing a computer to evaluate a characteristic of said second insulated gate transistor using a characteristic of said first insulated gate transistor as a reference, said computer readable recording medium comprising:

means for causing said computer to extract a threshold voltage for said first insulated gate transistor to estimate a threshold voltage for said second insulated gate transistor to define the estimated voltage as a first estimated value;

means for causing said computer to extract a hypothetical point at which a change in a total drain-to-source resistance is estimated to be approximately zero when a first gate overdrive and a second gate overdrive are slightly changed, based on a characteristic curve drawn in an X-Y plane with said mask channel length measured on an X-axis and said total drain-to-source resistance measured on a Y-axis, said characteristic curve indicating a relationship between said mask channel length of said first and second insulated gate transistors and said total drain-to-source resistance on a condition that said first and second gate overdrives are equal, a value of said mask channel length and a value of said total drain-to-source resistance at said hypothetical point being defined as second and third estimated values, respectively, said means also causing said computer to extract a slope of said characteristic curve at said hypothetical point to define a value of said slope as a fourth estimated value, said first gate overdrive being defined as a difference between the gate voltage of said first insulated gate transistor and the extracted threshold voltage of said first insulated gate transistor, said second gate overdrive being defined as a difference between the gate voltage of said second insulated gate transistor and said first estimated value;

means for causing said computer to determine optimum second to fourth estimated values that are respective ones of said second to fourth estimated values which satisfy that an amount of change in said third estimated value equals a product of an amount of change in said second estimated value and said fourth estimated value when said first and second gate overdrives are slightly changed, to determine an optimum first estimated value associated with said optimum second to fourth estimated values, thereby to determine a true threshold voltage of said second insulated gate transistor based on said optimum first estimated value; and means for causing said computer to determine a difference between said mask channel length and an effective channel length, and a series resistance, based on said true threshold voltage.

11. A computer readable recording medium storing therein a characteristic evaluation program and using at least two insulated gate transistors differing from each other only in mask channel length and including a first insulated gate transistor having a longer channel length and a second insulated gate transistor having a shorter channel length, said computer readable recording medium for causing a computer to evaluate a characteristic of said second insulated gate transistor using a characteristic of said first insulated gate transistor as a reference, said computer readable recording medium comprising:

means for causing said computer to extract a threshold voltage for said first insulated gate transistor to estimate a threshold voltage for said second insulated gate transistor to define the estimated voltage as a first estimated value;

means for causing said computer to extract a hypothetical point at which a change in a total drain-to-source resistance is estimated to be approximately zero when a first gate overdrive and a second gate overdrive are slightly changed, based on a characteristic curve drawn in an X-Y plane with said mask channel length measured on an X-axis and said total drain-to-source resistance measured on a Y-axis, the characteristic curve inidicating a relationship between said mask channel length of said first and second insulated gate transistors and said total drain-to-source resistance on a condition that said first and second gate overdrives are equal, a value of said mask channel length at said hypothetical point being defined as a second estimated value, said first gate overdrive being defined as a difference between the gate voltage of said first insulated gate transistor and the extracted threshold voltage of said first insulated gate transistor, said second gate overdrive being defined as a difference between the gate voltage of said second insulated gate transistor and said first estimated value;

means for causing said computer to determine an optimum first estimated value from said second estimated value, said optimum first estimated value satisfying that a characteristic curve indicating a relationship between said second gate overdrive measured on an X-axis and said second estimated value measured on a Y-axis has a predetermined configuration in a predetermined range of said second gate overdrive, to determine the determined optimum first estimated value as a true threshold voltage of said second insulated gate transistor; and means for causing said computer to determine a difference between said mask channel length and an effective channel length, and a series resistance, based on said true threshold voltage.

* * * * *